(12) United States Patent
Yamayoshi

(10) Patent No.: US 10,797,086 B2
(45) Date of Patent: Oct. 6, 2020

(54) LIQUID CRYSTAL DISPLAY PANEL AND METHOD OF MANUFACTURING THE SAME

(71) Applicant: Mitsubishi Electric Corporation, Tokyo (JP)

(72) Inventor: Kazushi Yamayoshi, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/180,153

(22) Filed: Nov. 5, 2018

(65) Prior Publication Data

US 2019/0172851 A1    Jun. 6, 2019

(30) Foreign Application Priority Data

Dec. 4, 2017  (JP) ................. 2017-232292

(51) Int. Cl.
*H01L 27/12* (2006.01)
*G02F 1/1343* (2006.01)
(Continued)

(52) U.S. Cl.
CPC ........ *H01L 27/1248* (2013.01); *G02F 1/1368* (2013.01); *G02F 1/133345* (2013.01);
(Continued)

(58) Field of Classification Search
CPC ............. H01L 27/1248; H01L 29/6675; H01L 21/0274; H01L 29/786; H01L 29/458;
(Continued)

(56) References Cited

U.S. PATENT DOCUMENTS

2008/0266227 A1* 10/2008 Arasawa ............. G09G 3/3611
345/89
2013/0126876 A1* 5/2013 Shin ..................... H01L 29/6675
257/59
(Continued)

FOREIGN PATENT DOCUMENTS

JP    2013-109347 A    6/2013
JP    2015-099287 A    5/2015
WO    2014/103915 A1    7/2014

*Primary Examiner* — Cuong B Nguyen
(74) *Attorney, Agent, or Firm* — Studebaker & Brackett PC

(57) ABSTRACT

A liquid crystal display panel includes a semiconductor film, source and drain electrodes, a planarizing insulating film, first and second transparent conductive films, an insulating film, a pixel electrode, and a counter electrode. The semiconductor film overlaps a gate electrode on a substrate across a gate insulating film. The source and drain electrodes are separately provided on the semiconductor film. The planarizing insulating film includes an opening for partially exposing the source and drain electrodes on its bottom. The first and second transparent conductive films respectively come in contact with surfaces of the source and drain electrodes. The insulating film is provided on the planarizing insulating film so as to cover the opening and the first and second transparent conductive films. The pixel electrode is provided on the insulating film and is electrically connected to the drain electrode via the second transparent conductive film. The counter electrode is opposed to the pixel electrode.

7 Claims, 16 Drawing Sheets

(51) Int. Cl.
  *G02F 1/1368*  (2006.01)
  *G02F 1/1362*  (2006.01)
  *H01L 29/786*  (2006.01)
  *H01L 21/027*  (2006.01)
  *H01L 29/66*   (2006.01)
  *G02F 1/1333*  (2006.01)

(52) U.S. Cl.
  CPC .. *G02F 1/134363* (2013.01); *G02F 1/136227* (2013.01); *G02F 1/136286* (2013.01); *H01L 21/0274* (2013.01); *H01L 29/6675* (2013.01); *H01L 29/786* (2013.01)

(58) Field of Classification Search
  CPC .......... H01L 29/41733; H01L 27/3248; H01L 27/32–3274; G02F 1/133345; G02F 1/136227; G02F 1/136286; G02F 1/1368; G02F 1/134363; G02F 2001/134372; G02F 1/34309; G02F 2201/123
  See application file for complete search history.

(56) References Cited

U.S. PATENT DOCUMENTS

| | | |
|---|---|---|
| 2015/0001541 A1 | 1/2015  | Shin et al. |
| 2015/0138481 A1 | 5/2015  | Yamayoshi et al. |
| 2015/0355516 A1 | 12/2015 | Imai et al. |

\* cited by examiner

F I G. 5
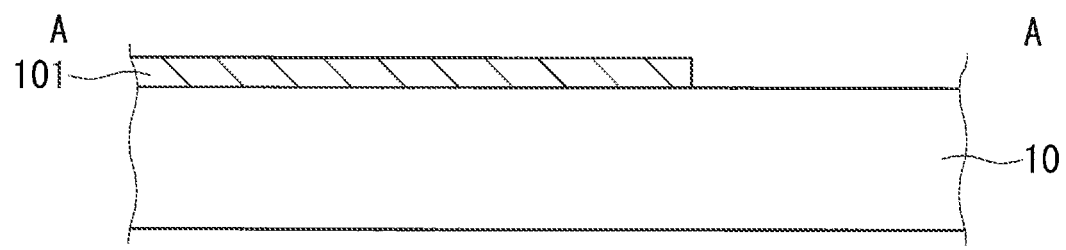

LIQUID CRYSTAL DISPLAY PANEL AND METHOD OF MANUFACTURING THE SAME

BACKGROUND OF THE INVENTION

Field of the Invention

The present invention relates to a liquid crystal display panel for a liquid crystal display device, and to a method of manufacturing the same.

Description of the Background Art

As a display method of a liquid crystal display device, a twisted nematic (TN) mode has been widely used. This mode employs a vertical electric field method in which liquid crystal molecules are driven by generation of an electric field substantially perpendicular to a panel. Meanwhile in recent years, a lateral electric field method has also been increasingly employed, in which liquid crystal molecules are horizontally driven by generation of an electric field substantially in parallel with a panel. The lateral electric field method is advantageous in achieving a wide viewing angle, high resolution, and high luminance. For this reason, the lateral electric field method is becoming to be primarily used particularly in small to medium sized panels as typified by, for example, a smartphone and a tablet. As one example of the lateral electric field method, a fringe field switching (FFS) mode is known.

In the FFS mode, a lower electrode and an upper electrode that has slits are provided across an insulating film. One of the electrodes is used as a pixel electrode, and the other electrode is used as a counter electrode.

When a voltage is applied between a pixel electrode and a common electrode (counter electrode) that is opposed to the pixel electrode in order to generate a lateral electric field, parasitic capacitance is generated between a signal line and the electrode (lower electrode) closer to a substrate among the two electrodes. A large parasitic capacitance may lead to low display quality. For the purpose of reducing parasitic capacitance, it is desirable that the insulating film between the lower electrode and the signal line have low relative permittivity and have a large thickness. In this respect, the insulating film is desirably an organic insulating film. The organic insulating film also has an advantage in capability of achieving flatness by covering level difference generated due to a thin film transistor (TFT) or the like. Further, if the organic insulating film has photosensitivity, an opening can be directly formed with photolithography.

According to one example disclosed in Japanese Patent Application Laid-Open No. 2013-109347, an organic insulating film has an opening for exposing a TFT. The opening includes an opening (a contact hole) of a passivation film that covers the TFT, and the pixel electrode is electrically connected to a drain electrode of the TFT through the contact hole. Further, it is also disclosed that photosensitive acrylic resin, another type of organic insulating film, or an inorganic insulating film is used as the organic insulating film.

According to Japanese Patent Application Laid-Open No. 2013-109347, the opening of the organic insulating film includes a contact hole of a passivation film and an organic insulating film. Therefore, the TFT needs to be exposed, and the opening is accordingly increased. Each opening corresponds to a non-display area of a liquid crystal display panel. A large proportion of a non-display area occupying in a display area is not preferable for a recent display panel that has been in the development for achieving higher resolution. Further, the configuration in which a contact hole of a passivation film is formed within the opening of an organic insulating film may cut off a connection path to a pixel electrode during a manufacturing process, which may in turn cause reduction in a manufacturing yield of the liquid crystal display panel.

SUMMARY

It is an object of the present invention to provide a liquid crystal display panel that is enhanced in display quality and in a manufacturing yield of the liquid crystal display panel by reducing the proportion of a non-display area occupying in a display area.

According to the present invention, a liquid crystal display panel includes a thin film transistor substrate in which a plurality of pixels are arranged in a matrix pattern. Each of the plurality of pixels includes a gate electrode, a gate insulating film, a semiconductor film, a source electrode and a drain electrode, a planarizing insulating film, a first transparent conductive film and a second transparent conductive film, an insulating film, a pixel electrode, and a counter electrode. The gate electrode is selectively disposed on a substrate. The gate insulating film covers the gate electrode. The semiconductor film is disposed on the gate insulating film so as to overlap the gate electrode. The source electrode and the drain electrode are provided on the semiconductor film so as to be separated apart from each other. The planarizing insulating film covers the gate insulating film. The planarizing insulating film includes an opening for partially exposing the source electrode and the drain electrode on a bottom of the opening. The first transparent conductive film and the second transparent conductive film are provided to extend from an upper surface of the planarizing insulating film toward a side surface of the opening and the bottom of the opening so as to respectively come in contact with a surface of the source electrode and a surface of the drain electrode that are exposed on the bottom of the opening. The insulating film is provided on the planarizing insulating film so as to cover the opening, the first transparent conductive film, and the second transparent conductive film. The pixel electrode is provided on the insulating film and is electrically connected to the drain electrode via the second transparent conductive film. The counter electrode is provided to be opposed to the pixel electrode across the insulating film. The pixel electrode is electrically connected to the drain electrode through a contact hole. The contact hole is provided in the insulating film to penetrate the insulating film at a position corresponding to a position above the second transparent conductive film and above the upper surface of the planarizing insulating film.

The pixel electrode in a topmost layer is electrically connected to the drain electrode through the contact hole provided at a position corresponding to a position above the upper surface of the planarizing insulating film. Therefore, as compared to a case where the contact hole of the insulating film is provided within the opening of the planarizing insulating film, a smaller opening area suffices, and the proportion of a non-display area occupying in a display area is thus prevented from being increased. Consequently, display quality of the liquid crystal display panel can be enhanced. Further, a connection path to the pixel electrode is less liable to be cut off during a manufacturing process, and a manufacturing yield of the liquid crystal display panel can be therefore enhanced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a cross-sectional view for illustrating the method of manufacturing the liquid crystal display panel according to the first preferred embodiment of the present invention.

DESCRIPTION OF THE PREFERRED EMBODIMENTS

Now, preferred embodiments of the present invention are described with reference to the drawings. Note that, in FIG. 1 and the succeeding drawings, the same reference symbols are given to the same or corresponding components, and description thereof is not repeated. The drawings are schematically illustrated, and are not to represent accurate size and the like of the illustrated components. Further, for the sake of avoiding complexity of the drawings, components other than essential components of the invention are omitted, and components are partially simplified, for example, as appropriate.

First Preferred Embodiment

<Configuration of Liquid Crystal Display Panel>

Figure 1:
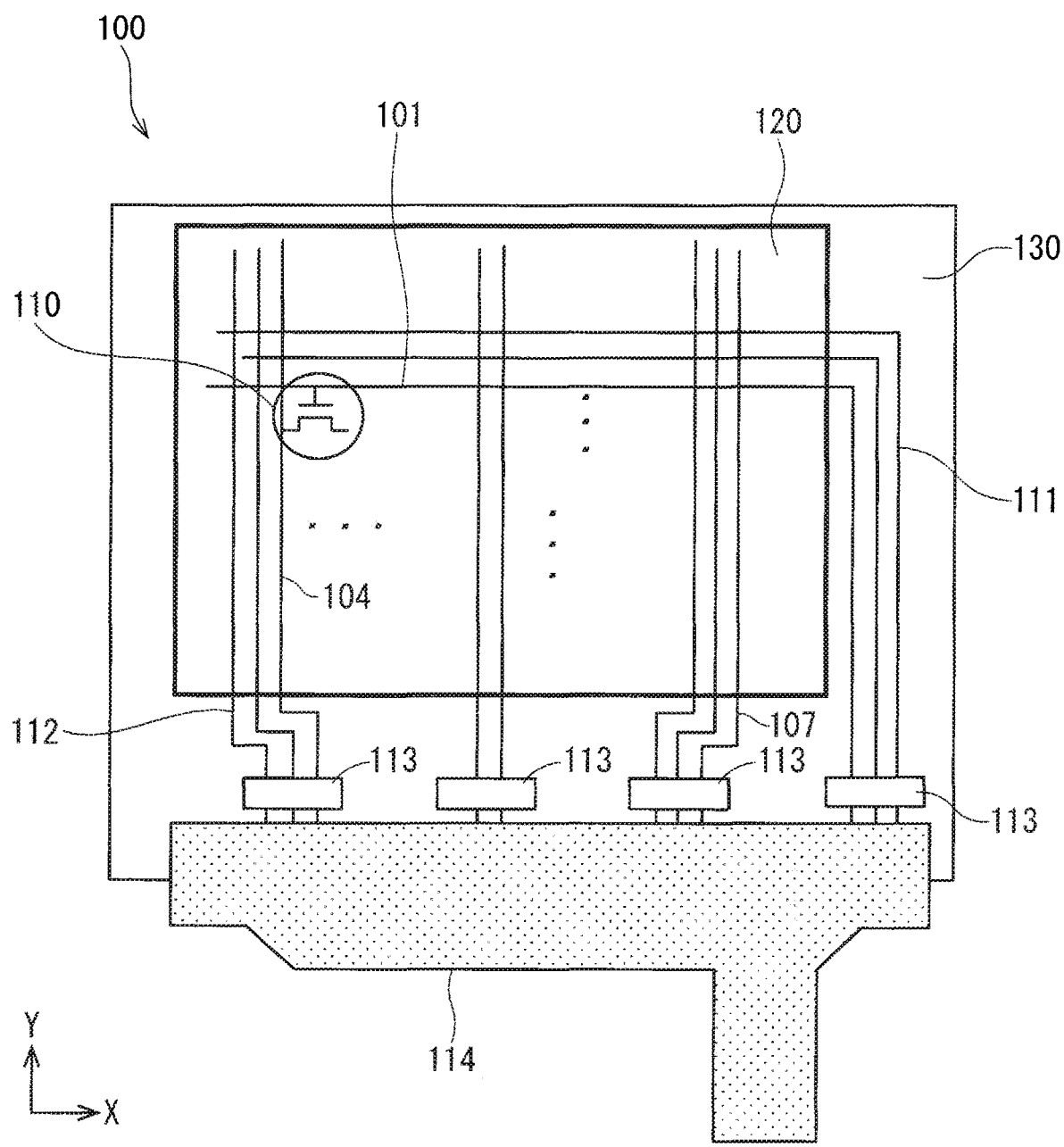
FIG. 1 is a plan view showing a configuration of an array substrate of a liquid crystal display panel.

FIG. 1 is a plan view of an array substrate 100 (a thin film transistor substrate) in which a plurality of pixels are arranged in a matrix pattern (array pattern), which is a part of a liquid crystal display panel of an FFS mode. The array substrate 100 includes a display area 120 in which an image is displayed, and a frame area 130 being a non-display area that borders on the display area 120. Here, as one example, the frame area 130 is provided to surround the display area 120. Further, although not shown, the liquid crystal display panel includes, in addition to the array substrate 100, a color filter substrate disposed to be opposed to the array substrate 100, and a liquid crystal layer disposed to be opposed to at least the display area 120 between the array substrate 100 and the color filter substrate. Note that, as the color filter substrate, a color filter substrate generally used in a liquid crystal display panel of an FFS mode is sufficient, and therefore detailed description thereof is omitted.

In the display area 120, a plurality of scanning lines 101 extending in a lateral direction (X direction) and a plurality of signal lines 104 extending in a vertical direction (Y direction) are disposed orthogonally to each other. One pixel is formed in an area surrounded by adjacent scanning line 101 and signal line 104. Thus, a plurality of pixels are arranged in a matrix pattern (array pattern). In each pixel, a TFT 110 is provided, which includes a gate electrode formed by a part of the scanning line 101, a source electrode formed by a part of the signal line 104, and a drain electrode formed by a part of a pixel electrode.

In the frame area 130, there are a plurality of external wires 111 extending respectively from the plurality of scanning lines 101, a plurality of external wires 112 extending respectively from the plurality of signal lines 104, a plurality of integrated circuit (IC) chips 113 connected to the plurality of external wires 111 and 112, and a printed circuit board 114 connected to the plurality of IC chips 113.

The plurality of external wires 111 and 112 are connected to a plurality of external-connection terminal electrodes (not shown) in the chips 113. The terminal electrode is electrically connected to a terminal (not shown) in the IC chip 113 via bumps or an anisotropic conductive film (ACF). Further, the terminal in the IC chip 113 is electrically connected to a terminal (not shown) in the printed circuit board 114 via bumps or an ACF.

The TFT 110 serves as a switching device that controls on and off of voltage supply from the signal line 104 to a display electrode. Specifically, when a gate signal is supplied from the scanning line 101, signal data is supplied from the signal line 104 such that a current flows from the source electrode toward the drain electrode in the TFT 110 owing to a voltage generated based on the signal data. That is, a voltage generated based on signal data supplied from the signal line 104 is applied to the pixel electrode. The signal data is generated in the IC chips 113 and the printed circuit board 114 based on display data coming from the outside, and a voltage generated in accordance with the display data from the outside is supplied to the pixel electrode via the TFT 110.

<Configuration of Pixels of Array Substrate>

Next, configuration of the array substrate 100 according to this preferred embodiment is described with reference to FIG. 2 and FIG. 3. Note that, while the present invention relates to a liquid crystal display panel, the present invention has features in configuration of pixels in particular. Therefore, the following description will be mainly given of the configuration of pixels.

Figure 2:
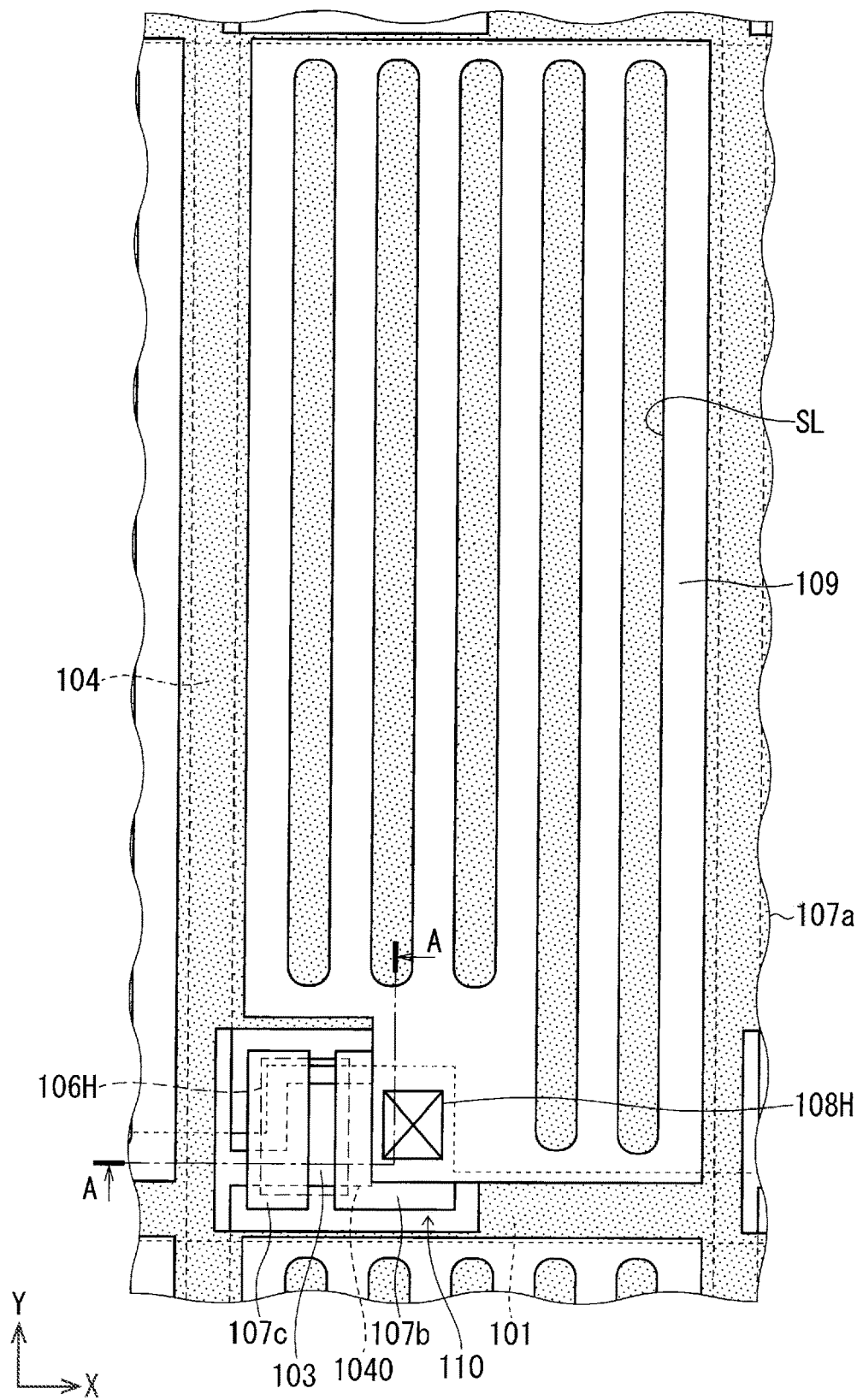
FIG. 2 is a plan view showing a configuration of a liquid crystal display panel according to a first preferred embodiment of the present invention.

FIG. 2 is a plan view showing plan configuration of one pixel formed in the display area 120 of FIG. 1. FIG. 3 is a cross-sectional view showing cross-sectional configuration taken along the line A-A of FIG. 2.

Figure 3:
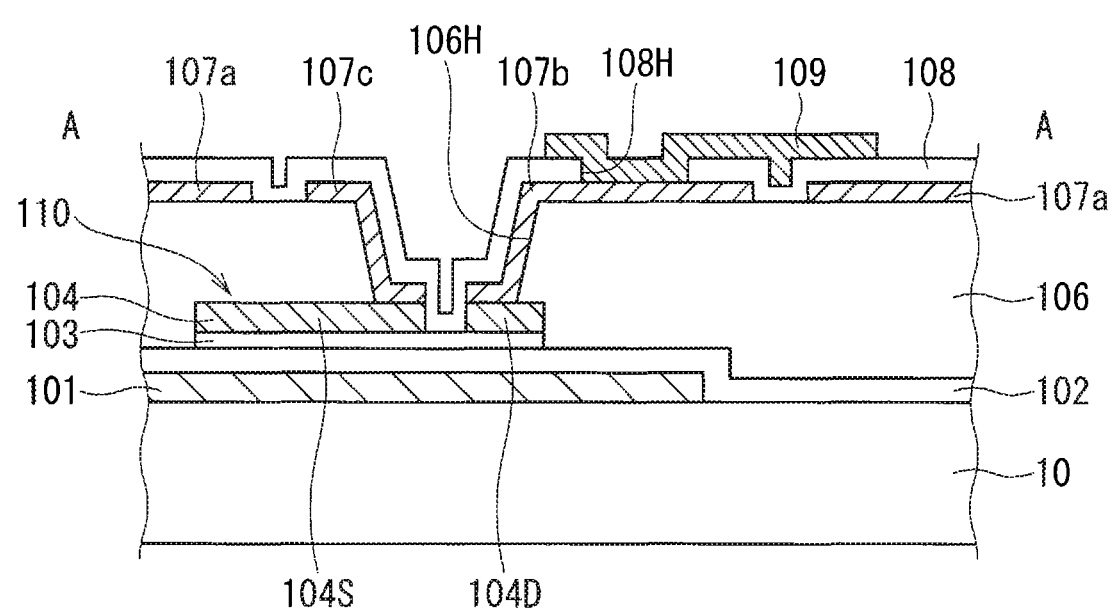
FIG. 3 is a cross-sectional view showing a configuration of the liquid crystal display panel according to the first preferred embodiment of the present invention.

As shown in FIG. 2 and FIG. 3, the array substrate 100 includes an insulating substrate 10 (a substrate), which is a substrate having light transmitting property and insulating property, such as a glass substrate. On the insulating substrate 10, the scanning line 101 extending in the X direction is selectively provided. A part of the scanning line 101 has a larger line width in the formation area of the TFT 110 than the other part, and the part having the larger line width serves as the gate electrode.

The scanning line 101 and the gate electrode are formed of metal, such as aluminium (Al), an alloy containing Al, copper (Cu), molybdenum (Mo), and chromium (Cr). Note that, since the scanning line and the gate electrode are integrated, they are respectively referred to as a scanning line 101 and a gate electrode 101, as appropriate.

As shown in FIG. 3, a gate insulating film 102 that covers the gate electrode 101 is provided on the insulating substrate 10. A material of the gate insulating film 102 is silicon nitride (SiN), for example.

As shown in FIG. 3, a semiconductor film 103 is selectively provided on the gate insulating film 102. The semiconductor film 103 is formed of an amorphous or crystalline silicon semiconductor film, or of an oxide semiconductor film, for example.

Here, if an amorphous silicon semiconductor film is used, a uniform film can be formed even on a large substrate, that is, uniform TFT characteristics can be attained. There is also an advantage in capability of being manufactured even on a low-cost glass substrate having poor heat resistance because the film can be deposited at a comparatively low temperature. However, the film contains a large amount of hydrogen and has many defect states, and therefore there are fears concerning TFT characteristics in that field effect mobility ($\mu$) may be 1 cm$^2$/V·sec or less, a leakage current (Ioff) may be large, and threshold voltage (Vth) shift may be caused due to stress of long period operation. If a crystalline silicon semiconductor film is used, such fears concerning TFT characteristics as in the case of using an amorphous silicon semiconductor film do not arise. Particularly, if a polycrystalline silicon semiconductor film is used as one example of the crystalline silicon semiconductor film, field effect mobility can be remarkably enhanced, which contributes to achieving higher resolution of the liquid crystal display panel.

Note that, if the semiconductor film 103 is formed of an amorphous silicon semiconductor film, a contact layer introduced with semiconductor impurity is provided on an upper layer of the amorphous silicon semiconductor film for the purpose of improving electrical conduction between the source electrode and the drain electrode.

As shown in FIG. 3, the signal line 104 is selectively provided on the semiconductor film 103. As shown in FIG. 2, the signal line 104 is provided to extend in the Y direction orthogonally to the scanning line 101. Further, in the formation area of the TFT 110, a part of the signal line 104 that branches in the X direction to be extended up to the top of the gate electrode 101 forms a signal line branch portion 104Q. The signal line branch portion 104Q is separated into two parts at its distal end; part of the signal line branch portion 104Q connected to the signal line 104 serves as a source electrode 104S, and the remaining part not connected to the signal line 104 serves as a drain electrode 104D.

The signal line 104, the source electrode 104S, and the drain electrode 104D are formed of the same material, specifically, metal such as Al, an alloy containing Al, Cu, Mo, and Cr, or of a stacked film made of such metal. Note that, the semiconductor film 103 is provided below the signal line 104, the source electrode 104S, and the drain electrode 104D.

Further, a planarizing insulating film 106 is provided on the insulating substrate 10 so as to cover the gate insulating film 102, the signal line 104, the source electrode 104S, and the drain electrode 104D. The planarizing insulating film 106 has an opening 106H for partially exposing each of the source electrode 104S and the drain electrode 104D. Note that, in FIG. 2, the opening 106H has a rectangular shape in plan view, but the shape is not limited thereto.

A material for the planarizing insulating film 106 is a siloxane resin film containing silicon. This film is referred to as a spin-on-glass (SOG) film, which is produced by the following process. Specifically, siloxane resin is mixed into an organic solvent to obtain an organic siloxane resin solution, and the solution is applied and cured (baked) to sublime organic components, thus producing a silicon oxide film.

A siloxane resin film containing silicon is characterized in its heat-resistant temperature of 270° C. or more, and is accordingly a film more resistant to high temperature than an acrylic resin-based planarizing insulating film (heat-resistant temperature of 230° C.). Further, the siloxane resin film has permittivity $\varepsilon$ of approximately from 3 to 4, which is lower than permittivity of from 6 to 7 of a SiN film, and therefore parasitic capacitance can be reduced. Further, by mixing photosensitive resin into a material of the SOG film, the siloxane resin film can have photosensitivity similarly to acrylic resin. A method of forming the planarizing insulating film 106 will be described later in detail.

A surface of the drain electrode 104D and a surface of the source electrode 104S that are exposed on the bottom of the opening 106H are respectively brought into contact with transparent conductive films 107b and 107c each extending from an upper surface of the planarizing insulating film 106 toward a side surface of the opening 106H. Further, a common electrode 107a (a counter electrode) out of contact with the transparent conductive films 107b and 107c is provided on the upper surface of the planarizing insulating film 106. The common electrode 107a is provided to cover the upper surface of the planarizing insulating film 106 except an area where the transparent conductive films 107b and 107c are provided. The outer edge of the planarizing insulating film 106 exists on the outside of the display area 120 (FIG. 1), and is connected to a common wire (not shown) in the frame area 130. The common electrode 107a and the transparent conductive films 107b and 107c are formed of the same material, specifically, a transparent conductive film made of indium tin oxide (ITO) or indium zinc oxide (IZO), for example.

An insulating film 108 that covers the common electrode 107a and the transparent conductive films 107b and 107c is provided on the planarizing insulating film 106. The insulating film 108 serves as a passivation (protective) film of the TFT 110, and also serves to generate a fringe field between the common electrode 107a and a pixel electrode 109. The pixel electrode 109 is provided to be opposed to the common electrode 107a (a counter electrode) across the insulating film 108. A material for the insulating film 108 is preferably an inorganic insulating film made of silicon nitride (SiN) or silicon oxide (SiO), for example. An inorganic insulating film can prevent deterioration of characteristics of the TFT 110 owing to moisture from the outside or the like.

The insulating film 108 has a contact hole 108H for partially exposing the transparent conductive film 107b. The contact hole 108H is provided at a position above the transparent conductive film 107b extending from the top of the drain electrode 104D, above the upper surface of the planarizing insulating film 106, and above the gate electrode 101.

If the contact hole 108H is provided within the opening 106H of the planarizing insulating film, the area of the opening 106H is increased, resulting in undesirably increasing the proportion of a non-display area occupying in the display area. Further, if the contact hole 108H is provided within the opening 106H, a connection path to the pixel electrode may be cut off during a manufacturing process depending on the shapes of the contact hole 108H, which may cause reduction in a manufacturing yield of the liquid crystal display panel. This will be described later in detail in the description of a manufacturing method. Note that, if the contact hole 108H is provided above the upper surface of the planarizing insulating film 106 and above the gate electrode 101, such problems as above do not arise.

The pixel electrode 109 is selectively provided on the insulating film 108, and is connected to the transparent conductive film 107b through the contact hole 108H. In this manner, the pixel electrode 109 is electrically connected to the drain electrode 104D. Note that, the pixel electrode 109 has a plurality of slits SL being slit openings. In FIG. 2, the slits SL each have an elongated shape extending in the Y direction in parallel with the signal line 104, and are arranged in rows in the X direction. However, the shape in plan view, the extending direction, and the arrangement of the slits SL are not limited thereto.

The outline of operation of the liquid crystal display panel per pixel having the above-mentioned configuration is as follows. The pixel electrode 109 in each pixel is disposed to overlap the common electrode 107a in a lower layer across the insulating film 108 in plan view. When a voltage is applied between the pixel electrode 109 and the common electrode 107a, a fringe field is generated between those electrodes. The fringe field propagates upward through the slits SL of the pixel electrode 109, passes toward the lateral direction (X direction) in a liquid crystal layer (not shown) disposed above the pixel electrode 109, and then passes toward the common electrode 107a located below. The fringe field includes an electric field that is substantially in parallel with the insulating substrate 10. The electric field drives liquid crystal molecules inside the liquid crystal layer in the lateral direction. In this manner, a polarization direction of light passing through the liquid crystal molecules can be appropriately changed per pixel, allowing desired display in the display area 120.

<Manufacturing Method>

Next, a method of manufacturing the array substrate 100 is described with reference to FIG. 4 to FIG. 15. First, a metal film is deposited on a substrate having light transmitting property and insulating property, i.e., on a glass substrate herein, using a sputter method, for example. As a material of the metal film, metal such as Al, an alloy containing Al, Cu, Mo, and Cr is used.

Figure 4:
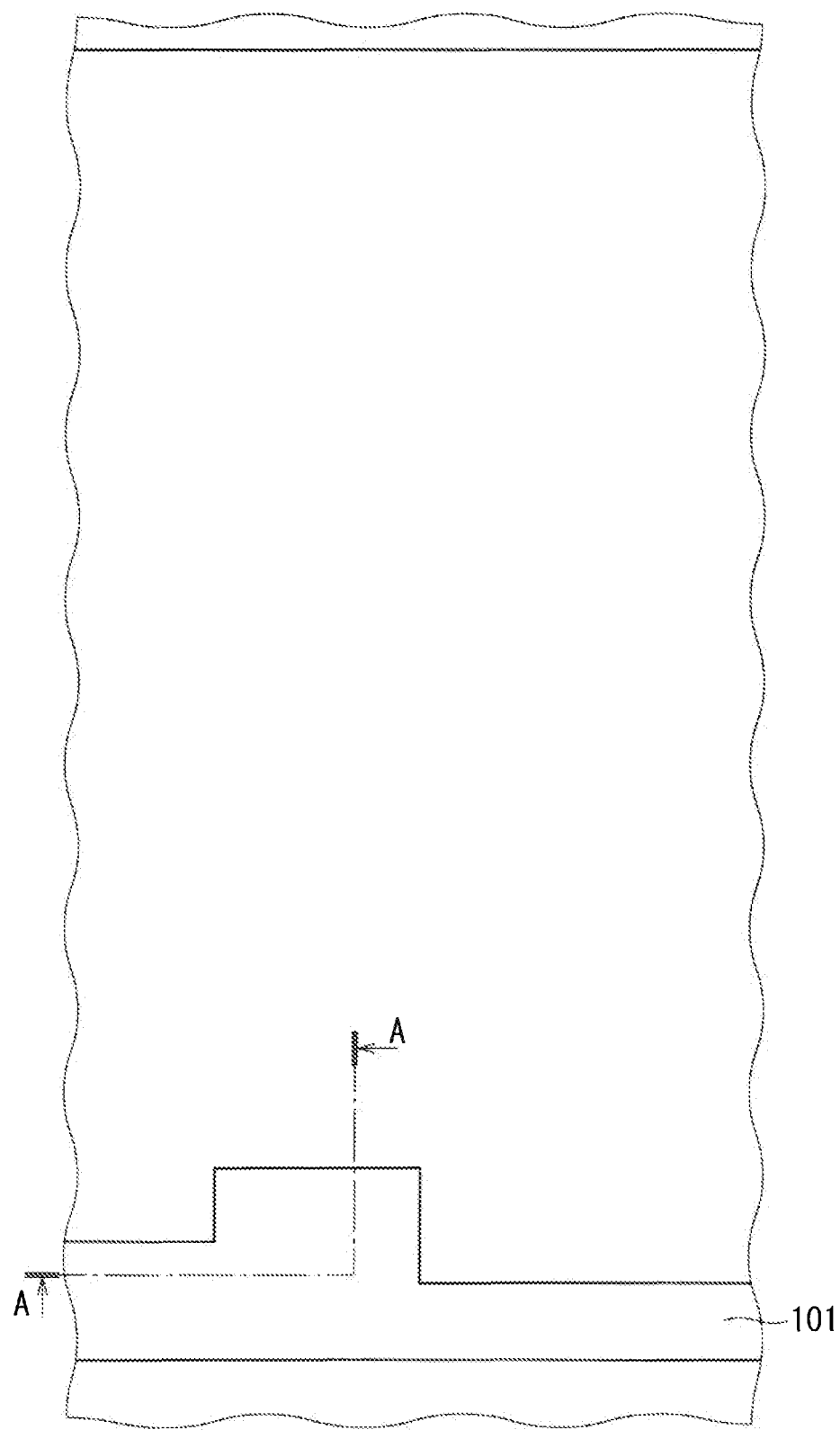
FIG. 4 is a plan view for illustrating a method of manufacturing the liquid crystal display panel according to the first preferred embodiment of the present invention.

Then, a first photolithography process is performed, where a photosensitive photoresist is applied onto the metal film with a slit method or a spin coat method, and the applied photoresist is exposed to light and then developed. In this manner, a photoresist pattern (a first photoresist pattern) having a desired shape is patterned on the metal film. After that, the metal film is etched using the first photoresist pattern as a mask, thereby patterning the metal film into a desired shape. After that, the first photoresist pattern is removed. With this, as shown in FIG. 4 and FIG. 5, the scanning line 101 having a larger line width in the formation area of the TFT 110 than in the other part is formed on the insulating substrate 10, and the part having the larger line width serves as the gate electrode 101. Note that, the first photoresist pattern also has a pattern of the external wires 111 of the frame area 130 (FIG. 1), and thus the external wires 111 are also simultaneously formed.

Figure 6:
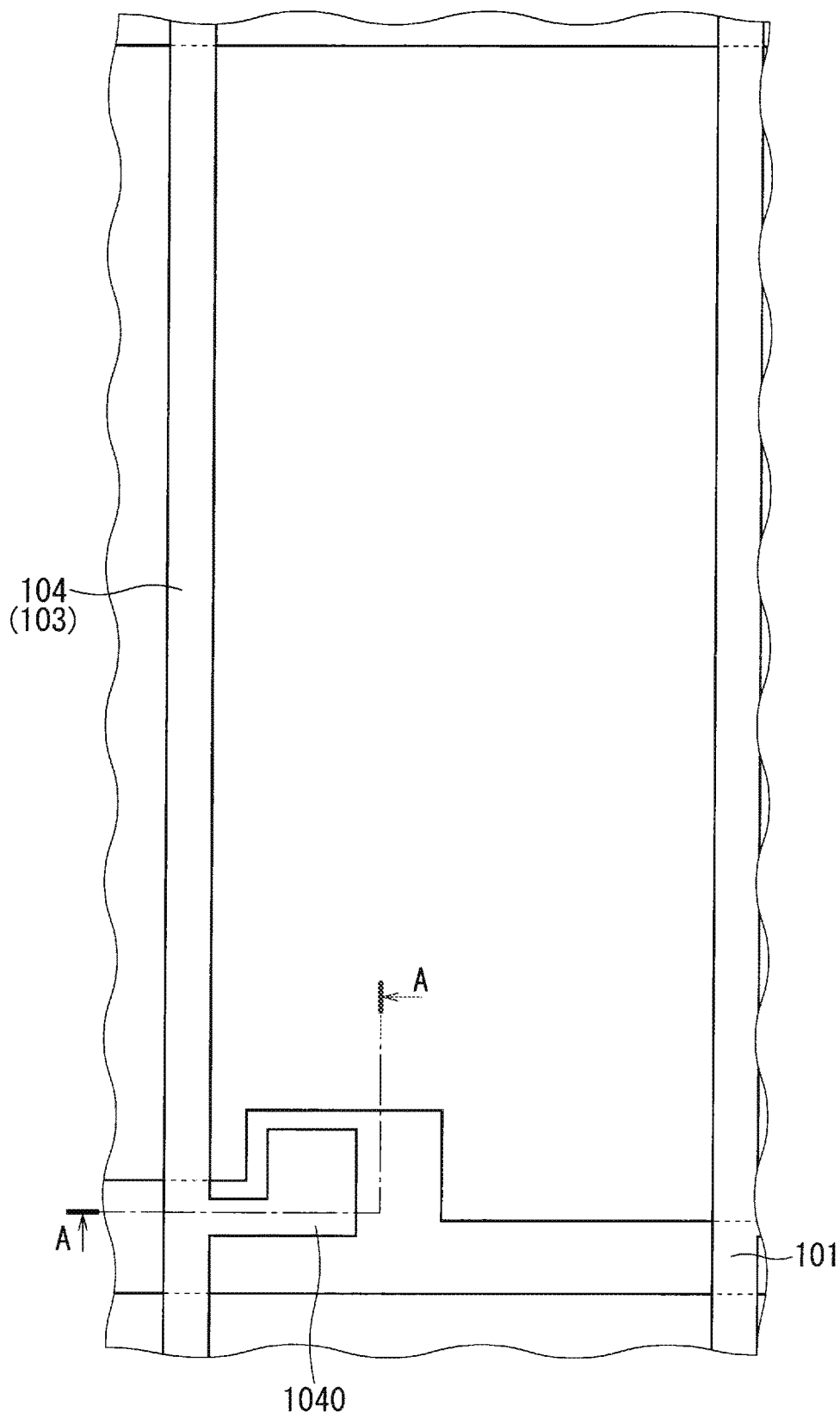
FIG. 6 is a plan view for illustrating the method of manufacturing the liquid crystal display panel according to the first preferred embodiment of the present invention.
Figure 7:
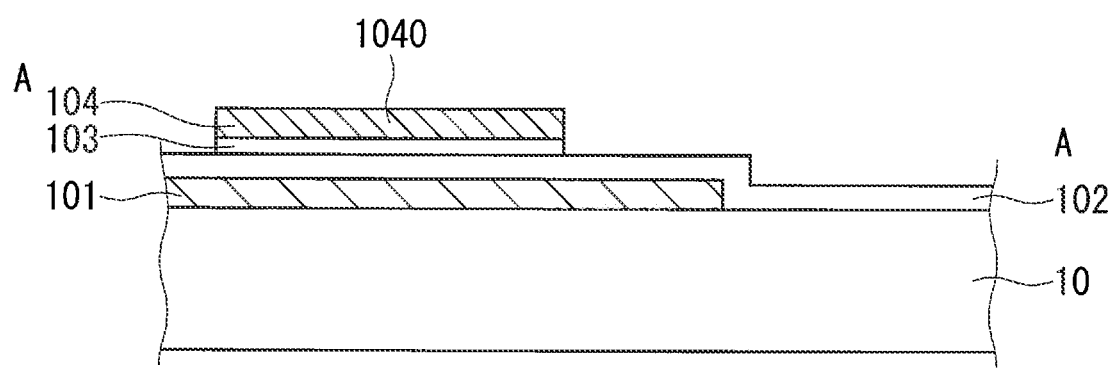
FIG. 7 is a cross-sectional view for illustrating the method of manufacturing the liquid crystal display panel according to the first preferred embodiment of the present invention.

Next, as shown in FIG. 6 and FIG. 7, the gate insulating film 102 that covers the insulating substrate 10 is formed. As the gate insulating film 102, for example, a silicon nitride (SiN) film deposited with a plasma chemical vapor deposition (CVD) method is used.

Next, a semiconductor film is formed on the gate insulating film 102. For example, if an amorphous silicon semiconductor film is used as the semiconductor film, it is desirable that a contact layer introduced with semiconductor impurity be provided in an upper layer of the amorphous silicon semiconductor film. The semiconductor film is deposited with a plasma CVD method, similarly to the gate insulating film 102. If a contact layer is provided in an upper layer of the amorphous silicon semiconductor film, it is desirable that the deposition of the amorphous silicon semiconductor film and the deposition of the contact layer be performed in succession; after the deposition of an amorphous silicon semiconductor film, the insulating substrate 10 is transferred into a deposition chamber for forming a contact layer under a vacuum environment without exposing the insulating substrate 10 to ambient air. With this, an interface between the amorphous silicon semiconductor film and the contact layer can be prevented from being contaminated. Note that, in depositing the contact layer, a minute amount of phosphorous (P) is added to a deposition gas for the amorphous silicon semiconductor film such that the contact layer has a conductivity type of an n type ($n^+$).

Next, a metal film is deposited on the semiconductor film using a sputter method, for example. As a material of the metal film, metal such as Al, an alloy containing Al, Cu, Mo, and Cr is used.

Then, a second photolithography process is performed, where a photosensitive photoresist is applied onto the metal film with a slit method or a spin coat method, and the applied photoresist is exposed to light and then developed. In this manner, a photoresist pattern (a second photoresist pattern) having a desired shape is patterned on the metal film. After that, the metal film and the semiconductor film (in some cases also including the contact layer and the amorphous silicon semiconductor film) are sequentially etched using the second photoresist pattern as a mask, and the second photoresist pattern is then removed. With this, as shown in FIG. 6 and FIG. 7, the signal line 104, the signal line branch portion 1040, and the external wires 112 of the frame area 130 (FIG. 1) are formed on the gate insulating film 102.

Further, the semiconductor film 103 exists below such components, which forms a so-called redundant wiring structure to reduce disconnection. Thus, occurrence of failures due to disconnection can be reduced.

Note that, at this point, the signal line branch portion 1040 is not separated into two parts, and accordingly a source electrode and a drain electrode of the TFT 110 are not formed.

Figure 8:
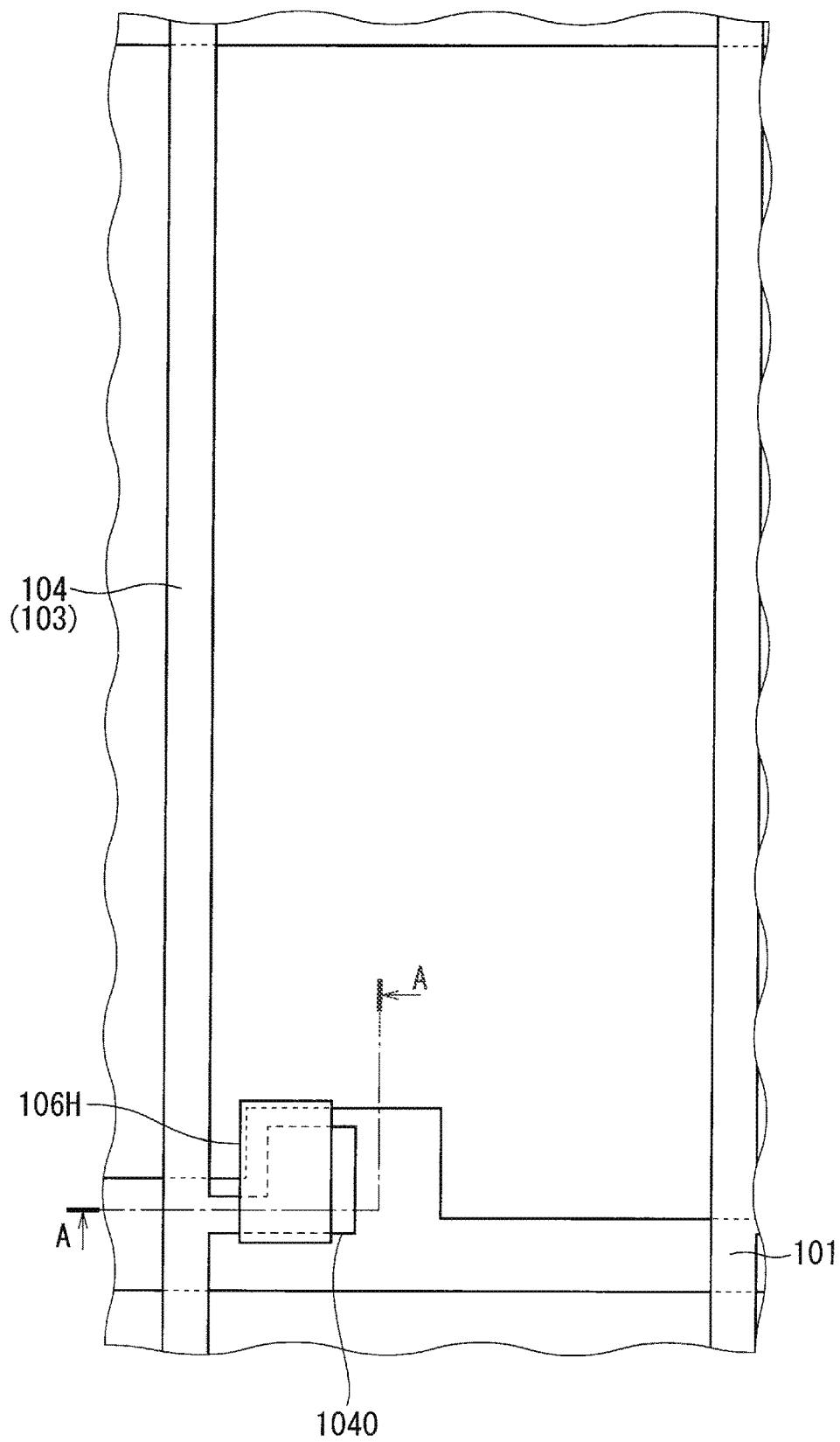
FIG. 8 is a plan view for illustrating the method of manufacturing the liquid crystal display panel according to the first preferred embodiment of the present invention.
Figure 9:
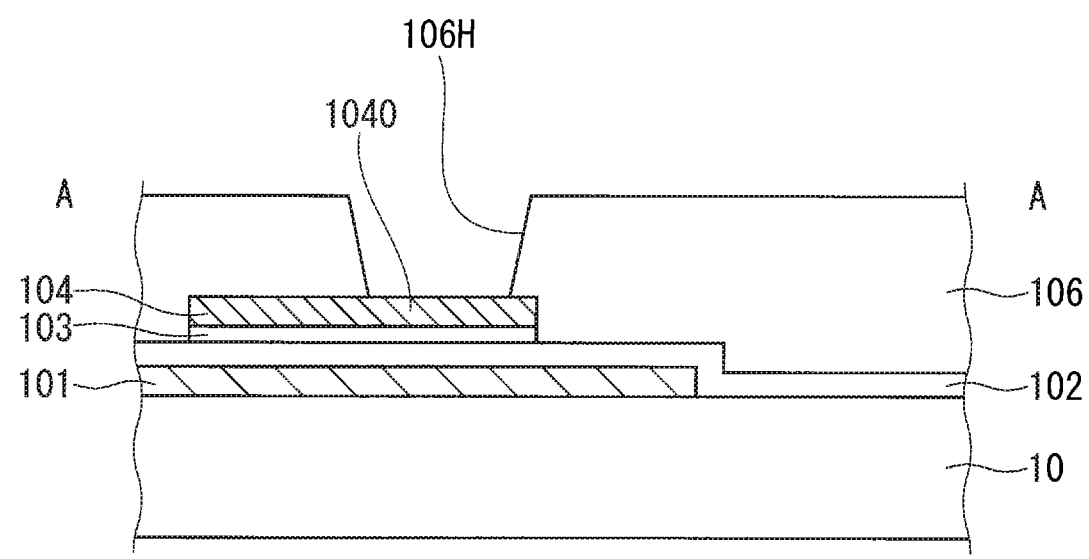
FIG. 9 is a cross-sectional view for illustrating the method of manufacturing the liquid crystal display panel according to the first preferred embodiment of the present invention.

Next, as shown in FIG. 8 and FIG. 9, the planarizing insulating film 106 is formed on the gate insulating film 102 so as to cover the signal line 104 and the signal line branch portion 1040, and the opening 106H is formed in the planarizing insulating film 106 so as to partially expose the signal line branch portion 1040. It is preferable that the planarizing insulating film 106 be a SOG film formed of siloxane resin containing silicon and have photosensitivity. If the planarizing insulating film 106 has photosensitivity, the planarizing insulating film 106 can be patterned through a third photolithography process similarly to a photoresist, allowing formation of the opening 106H. If the planarizing insulating film 106 does not have photosensitivity, after the formation of the planarizing insulating film 106, a photoresist pattern having an opening at a portion corresponding to a position to form the opening 106H is formed on the planarizing insulating film 106, and the planarizing insulating film 106 is then etched using the photoresist pattern as an etching mask, to thereby form the opening 106H.

The following description will be given of a case where the planarizing insulating film 106 is a SOG film having photosensitivity. The film thickness of the planarizing insulating film 106 is arranged to range from 1.0 to 3.0 μm, preferably 2.0 μm. As the planarizing insulating film 106, a photosensitive resin film is used, which is obtained by applying an organic siloxane resin solution (containing photosensitive resin) onto the gate insulating film 102 with a slit method or a spin coat method. After that, the opening 106H is formed by exposure and development such that an area of the signal line branch portion 1040 to become a source electrode and a drain electrode is partially exposed. After the formation of the opening 106H, a process (bleaching process) irradiating the entire surface with ultraviolet light is performed so as to cause photodissociation of photosensitive components contained in the planarizing insulating film 106, and a cure/bake process is then performed at 200° C. or more. The bleaching process is performed in order to decompose light-absorbing photosensitive components, and to thereby prevent reduction in light transmittance of the planarizing insulating film 106. The cure/bake process is performed in order to sublime organic components contained in the planarizing insulating film 106, and to thereby obtain a silicon oxide film. Note that, as one example of the conditions of the cure/bake process, baking is performed at a temperature of 300° C. for 60 minutes.

Figure 10:
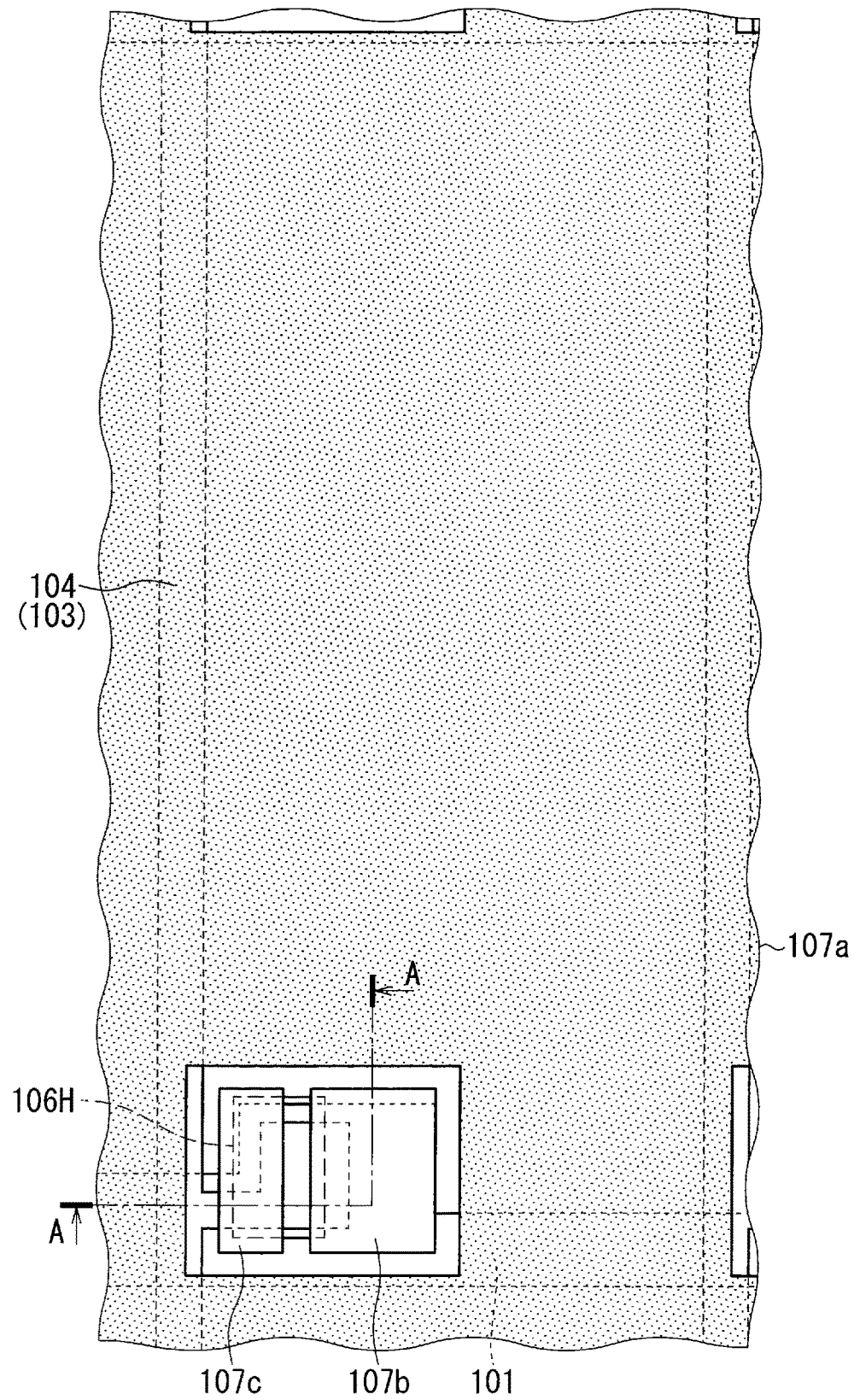
FIG. 10 is a plan view for illustrating the method of manufacturing the liquid crystal display panel according to the first preferred embodiment of the present invention.
Figure 11:
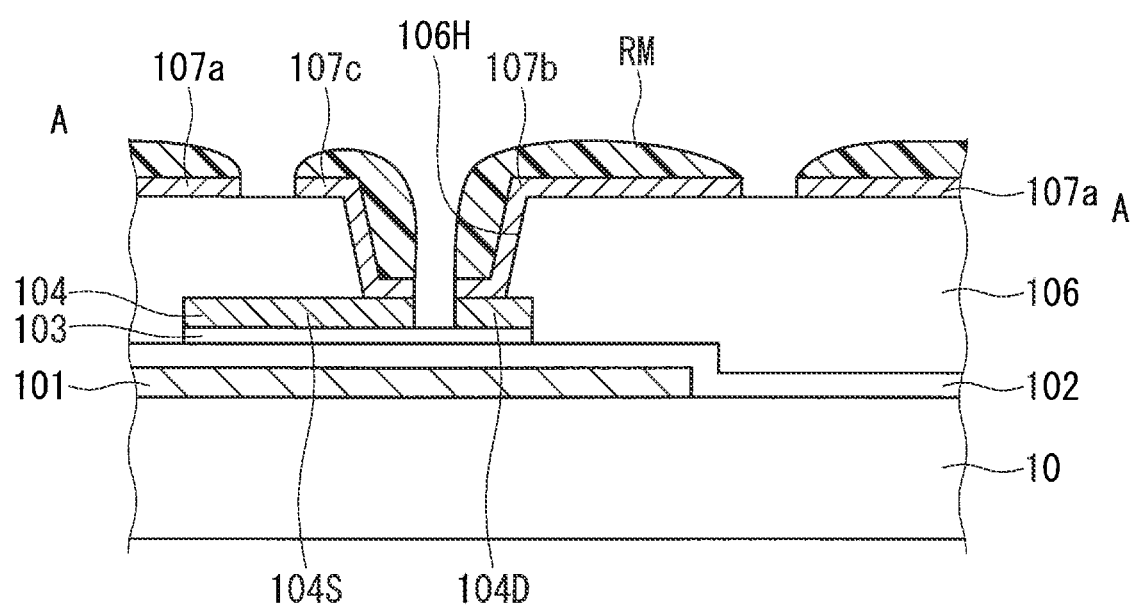
FIG. 11 is a cross-sectional view for illustrating the method of manufacturing the liquid crystal display panel according to the first preferred embodiment of the present invention.

Next, as shown in FIG. 10 and FIG. 11, a transparent conductive film of indium tin oxide (ITO), indium zinc oxide (IZO), or the like is formed on the planarizing insulating film 106 using a sputter method, for example. After that, a fourth photolithography process is performed, where a photosensitive photoresist is applied onto the transparent conductive film with a slit method or a spin coat method, and the applied photoresist is exposed to light and then developed. In this manner, a photoresist pattern (a third photoresist pattern) RM having a desired shape is patterned on the transparent conductive film.

The third photoresist pattern RM has a pattern for separating a part of the signal line branch portion 1040 to become a source electrode and a drain electrode of the TFT 110 in the opening 106H of the planarizing insulating film 106. Further, the third photoresist pattern RM has a pattern of covering an area from a surface of the signal line branch portion 1040 to become a drain electrode and a surface of the signal line branch portion 1040 to become a source electrode that are exposed on the bottom of the opening 106H toward a side surface of the opening 106H and the upper surface of the planarizing insulating film 106, and also a pattern of covering the formation area of the common electrode 107a on the upper surface of the planarizing insulating film 106.

Then, the transparent conductive film is etched using the third photoresist pattern RM as a mask. With this, the transparent conductive film is separated into the common electrode 107a, the transparent conductive film 107b, and the transparent conductive film 107c. Note that, as the etching of the transparent conductive film, wet etching using an oxalic acid-based solution is performed.

Next, with the third photoresist pattern RM remaining, etching for separating a source electrode and a drain electrode of the TFT 110 at the signal line branch portion 1040 is performed such that the source electrode 104S and the drain electrode 104D are separated on the semiconductor film 103. A surface of the semiconductor film 103 is exposed between the source electrode 104S and the opposing drain electrode 104D. Note that, as the etching of the metal film of Al or the like that forms the signal line branch portion 1040, an etching method and etching conditions are appropriately arranged depending on materials of the metal film; however, adoption of conventional etching conditions suffices, and therefore description thereof is omitted.

In this manner, since the common electrode 107a, the transparent conductive film 107b, the transparent conductive film 107c, the source electrode 104S, and the drain electrode 104D are patterned using the third photoresist pattern RM as a common mask, a single photolithography process and a single type of photoresist pattern suffice. Accordingly, manufacturing costs can be reduced.

Here, if a surface of the semiconductor film 103 serves as a contact layer added with semiconductor impurity, a back channel etching (BCE) process is required, where only the contact layer at the separation portion between the source electrode 104S and the drain electrode 104D is removed, with the semiconductor layer in a lower layer of the contact layer remaining. Dry etching is employed for the removal of the contact layer. In this case, depending on the film thickness and an etching rate of the contact layer, etching is performed by employing dry etching using a chlorine-based or fluorine-based gas, such as carbon tetrachloride ($CCl_4$), carbon tetrafluoride ($CF_4$), and sulfur hexafluoride ($SF_6$), with an etching period adjusted within a range of from 10 to 30 seconds such that the semiconductor layer in a lower layer remains.

Now, relationship between the BCE process and the film thickness of the planarizing insulating film 106 is described. As in the description above, a SOG film is used as the planarizing insulating film 106. Hitherto, an organic insulating film made of acrylic resin or the like has been generally used. One reason for using a SOG film in this preferred embodiment is that the SOG film, in comparison with acrylic resin, is less subjected to damage of dry etching in the BCE process.

Specifically, if acrylic resin is used in the planarizing insulating film 106, the exposed surface of the planarizing insulating film 106 is partially undesirably subjected to the damage of dry etching simultaneously with the removal of the contact layer at the separation portion between the source electrode 104S and the drain electrode 104D. According to an investigation made by the inventor, the etched amount of respective films in the BCE process is as follows:

Acrylic resin film; 2.000 μm/min or more, SOG film; 0.021 μm/min, and Amorphous silicon film; 0.325 μm/min.

The result shows that the SOG film is less liable to be etched, considering that the contact layer is a layer obtained by introducing impurity into an amorphous silicon film. This is an ideal characteristic for a planarizing insulating film.

Next, reasons for arranging the film thickness of the planarizing insulating film 106 to range from 1.0 to 3.0 μm are given below. In the fourth photolithography process, it is necessary to separate the photoresist pattern for the common electrode 107a on the upper surface of the planarizing insulating film 106 and the source electrode 104S and the drain electrode 104D in the opening 106H of the planarizing insulating film 106, as well as to form the photoresist pattern for forming the transparent conductive film 107b and the transparent conductive film 107c, simultaneously. However, with the existing photolithography exposure facility, it is difficult to collectively expose portions having height difference of 3.0 μm or more to light because of the focal length.

Further, if the SOG film is excessively thick, in stripping the third photoresist pattern RM after the BCE process, organic amine components in a stripping solution for stripping a photoresist permeate into the SOG film to swell and cause cracking in the SOG film itself, or cause the SOG film to be stripped from the insulating substrate 10. For such reasons, the film thickness of the SOG film is arranged to range from 1.0 to 3.0 preferably 2.0 μm.

Figure 12:
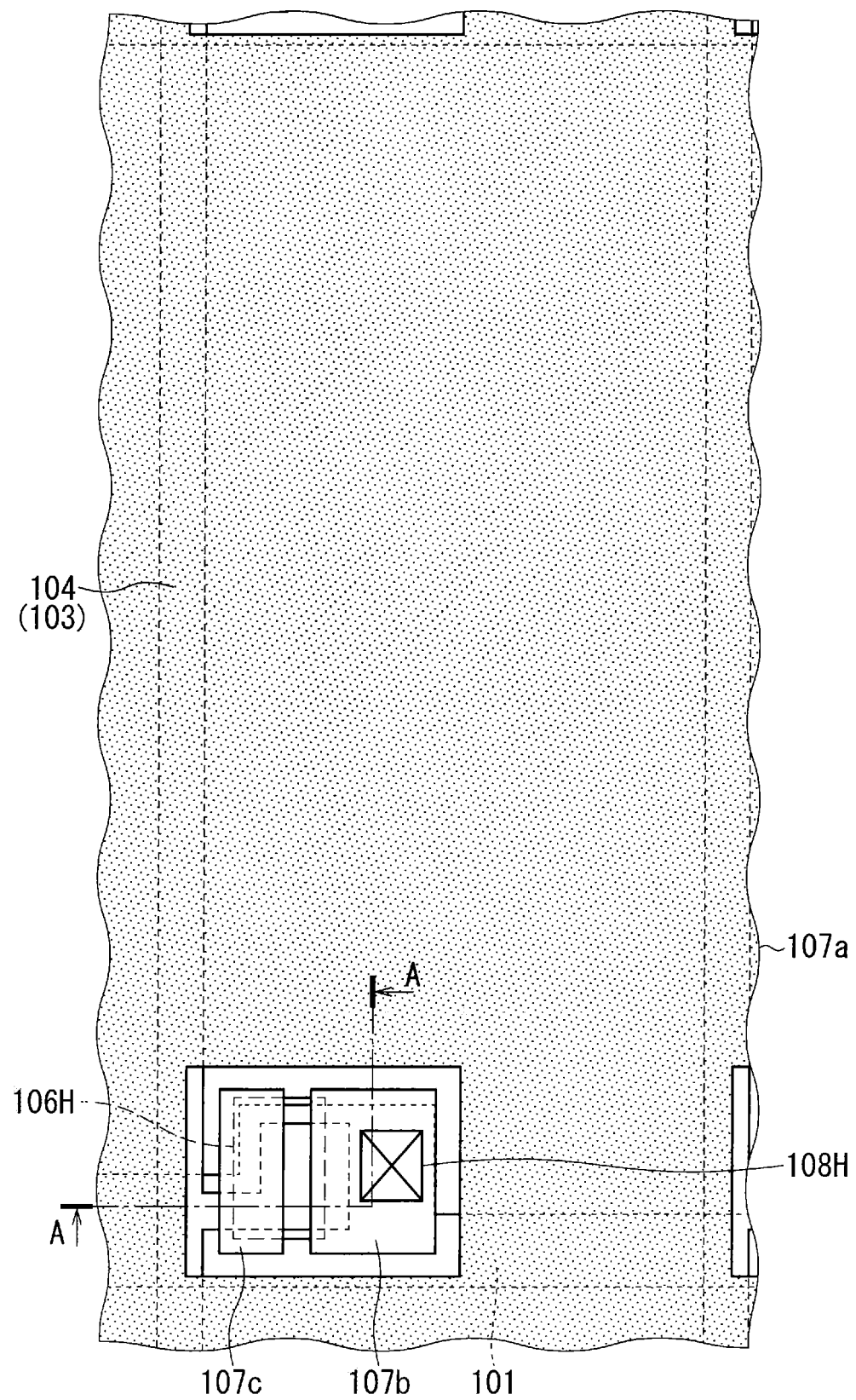
FIG. 12 is a plan view for illustrating the method of manufacturing the liquid crystal display panel according to the first preferred embodiment of the present invention.
Figure 13:
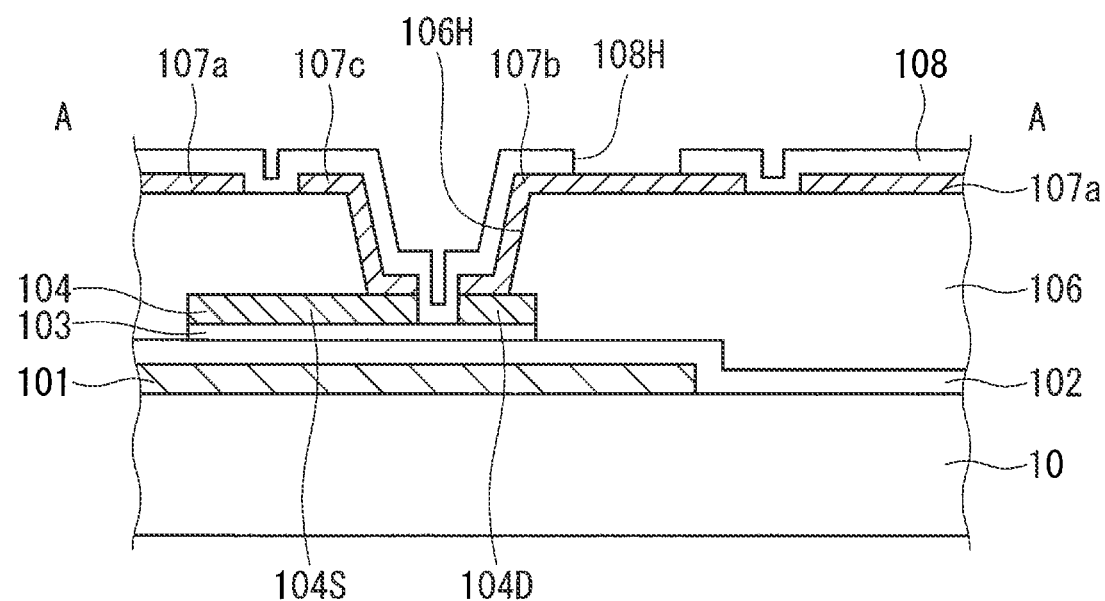
FIG. 13 is a cross-sectional view for illustrating the method of manufacturing the liquid crystal display panel according to the first preferred embodiment of the present invention.

Next, as shown in FIG. 12 and FIG. 13, a silicon nitride film is deposited on the planarizing insulating film 106 with a plasma CVD method, for example, to form the insulating film 108 that covers the common electrode 107a, the transparent conductive film 107b, and the transparent conductive film 107c. In the insulating film 108, the contact hole 108H is formed at a position above the transparent conductive film 107b, above the upper surface of the planarizing insulating film 106, and above the gate electrode 101. The insulating film 108 serves as a protective film of the TFT 110.

Incidentally, if moisture from the outside and the inside of the insulating film 108 is not fully blocked, the characteristics of the TFT 110 are deteriorated and proper operation of the TFT cannot be performed, which may degrade display quality. In view of this, the insulating film 108 is required to have satisfactory film quality. In order to achieve this, it is desirable that the film be deposited with a deposition temperature of the plasma CVD method of approximately 270° C. If acrylic resin is used in the planarizing insulating film 106, heating of the acrylic resin at 230° C. or more causes oxidation reaction, and transmittance is thereby lowered. In contrast, if a siloxane resin film containing silicon, i.e., a SOG film, is used as the planarizing insulating film 106, there is no problem as to heating at approximately up to 300° C. Therefore, the deposition temperature of the insulating film 108 is arranged to be 270° C.

Figure 14:
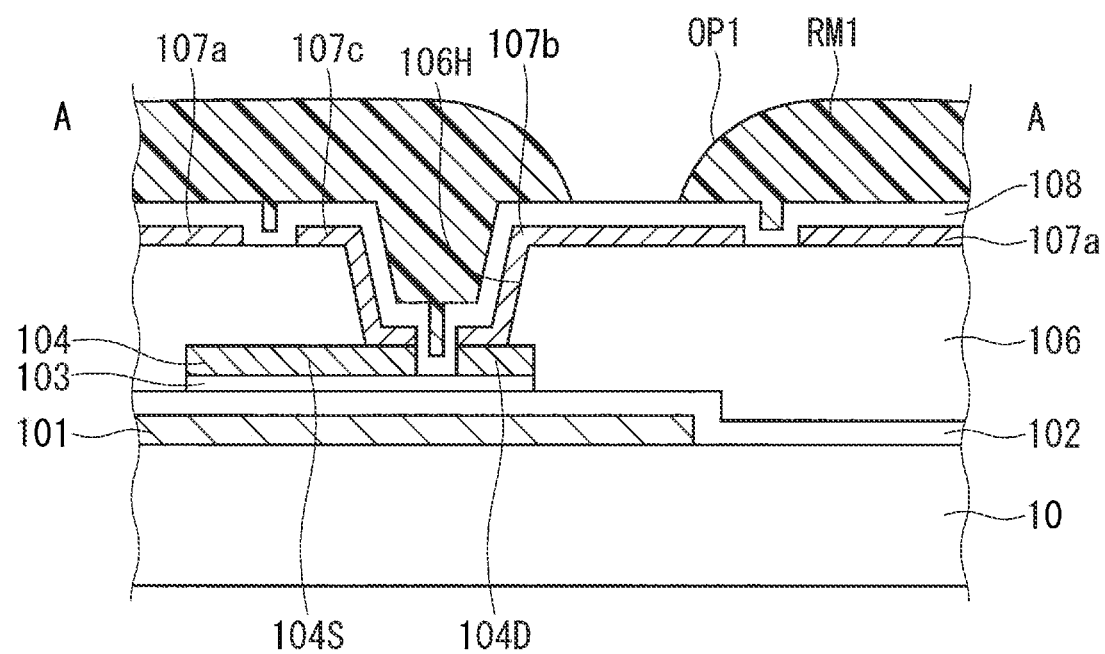
FIG. 14 is a cross-sectional view showing a formation state of a photoresist pattern.

In the formation of the contact hole 108H, a fifth photolithography process is performed, where a photosensitive photoresist is applied onto the insulating film 108 with a slit method or a spin coat method, and the applied photoresist is exposed to light and then developed. With this, as shown in FIG. 14, a fourth photoresist pattern RM1 is patterned on the insulating film 108.

Note that, in applying the photoresist, applied film thickness is arranged such that the upper surface of the planarizing insulating film 106 can be sufficiently coated. Specifically, since a dry etching process is required to form the contact hole 108H in the insulating film 108, the fourth photoresist pattern RM1 is accordingly etched to reduce its film thickness during the etching process. In view of this, in consideration of the amount of the film thickness to be reduced during the dry etching process, the film thickness of the fourth photoresist pattern RM1 is arranged such that the upper surface of the planarizing insulating film 106 can be sufficiently coated.

The fourth photoresist pattern RM1 has an opening OP1 at a portion corresponding to a position to form the contact hole 108H. The opening OP1 has such a tapered shape that the cross-sectional shape has a wide upper side and a narrow lower side.

When the insulating film 108 is etched through such an opening OP1, the cross-sectional shape of the contact hole 108H is formed into a tapered shape as well, and a connection path to the pixel electrode is thereby less liable to be cut off during a manufacturing process.

Further, as shown in FIG. 13, the contact hole 108H is formed at a position above the transparent conductive film 107b, above the upper surface of the planarizing insulating film 106, and above the gate electrode 101. The reason for forming the contact hole 108H at such a position is described below.

As in the description above, if the contact hole 108H is provided within the opening 106H of the planarizing insulating film 106, the area of the opening 106H is increased, resulting in undesirably increasing the proportion of a non-display area occupying in the display area. This is not preferable for a recent display panel that has been in the development for achieving higher resolution.

Further, if the contact hole 108H is provided within the opening 106H, a connection path to the pixel electrode may be cut off during a manufacturing process depending on the shapes of the contact hole 108H. The reason is described below.

Specifically, if the fourth photoresist pattern is provided within the opening 106H, the level difference of the planarizing insulating film 106 generates film thickness difference in the photoresist between the upper surface of the planarizing insulating film 106 and the opening 106H. This causes reflow (heat sagging) toward a portion having large resist film thickness during baking for forming the photoresist pattern, which in turn causes the middle portion of the resist film present on the side surface of the opening 106H to bulge. As a result, in the opening 106H, the cross-sectional shape of an opening for providing the contact hole 108H has an inverted-tapered shape having a narrow upper side and a wide lower side, which may be a cause of failures during the etching of the insulating film 108.

Further, if such a photoresist pattern is used as a mask, the cross-sectional shape of the contact hole 108H can only be formed into an upright shape, an overhang shape, or an inverted-tapered shape with respect to the insulating substrate 10. Thus, coatability of the pixel electrode 109 to be formed on the insulating film 108 is deteriorated, resulting in a higher risk of cutting off a connection path to the pixel electrode 109. The same happens also when the contact hole 108H is formed on a side portion of the opening 106H of the planarizing insulating film 106.

In contrast, the photoresist pattern formed above the upper surface of the planarizing insulating film 106 does not cause such problems, and does not cause disconnection of a connection path to the pixel electrode 109. Therefore, reduction in a manufacturing yield of the liquid crystal display panel can be prevented, which leads to enhancement in reliability and enhancement in quality.

Further, increase in a non-display area can be circumvented by providing the contact hole 108H above the gate electrode 101. Specifically, since the gate electrode 101 corresponds to a non-display area, the non-display area is not extended.

After the formation of the contact hole 108H, the fourth photoresist pattern RM1 is stripped, and then a transparent conductive film of indium tin oxide (ITO), indium zinc oxide (IZO), or the like is deposited on the insulating film 108 using a sputter method, for example.

After that, a sixth photolithography process is performed, where a photosensitive photoresist is applied onto the transparent conductive film with a slit method or a spin coat method, and the applied photoresist is exposed to light and then developed. Through the sixth photolithography process, a fifth photoresist pattern is formed, and the transparent conductive film is etched using the fifth photoresist pattern as a mask, thereby forming the pixel electrode 109. Note that, as the etching of the transparent conductive film, wet etching using an oxalic acid-based solution is performed. Finally, the fifth photoresist pattern is stripped. With this, the array substrate 100 shown in FIG. 2 and FIG. 3 is obtained.

In this manner, the array substrate 100 can be obtained through six photolithography processes. Thus, manufacturing costs can be reduced.

<Modification>

The array substrate 100 according to the first preferred embodiment described above has a configuration in which the pixel electrode 109 serves as an upper electrode and the common electrode 107a serves as a lower electrode across the insulating film 108, and the pixel electrode 109 has the slits SL. However, the upper-lower positional relationship between the pixel electrode and the common electrode may be interchanged.

Figure 15:
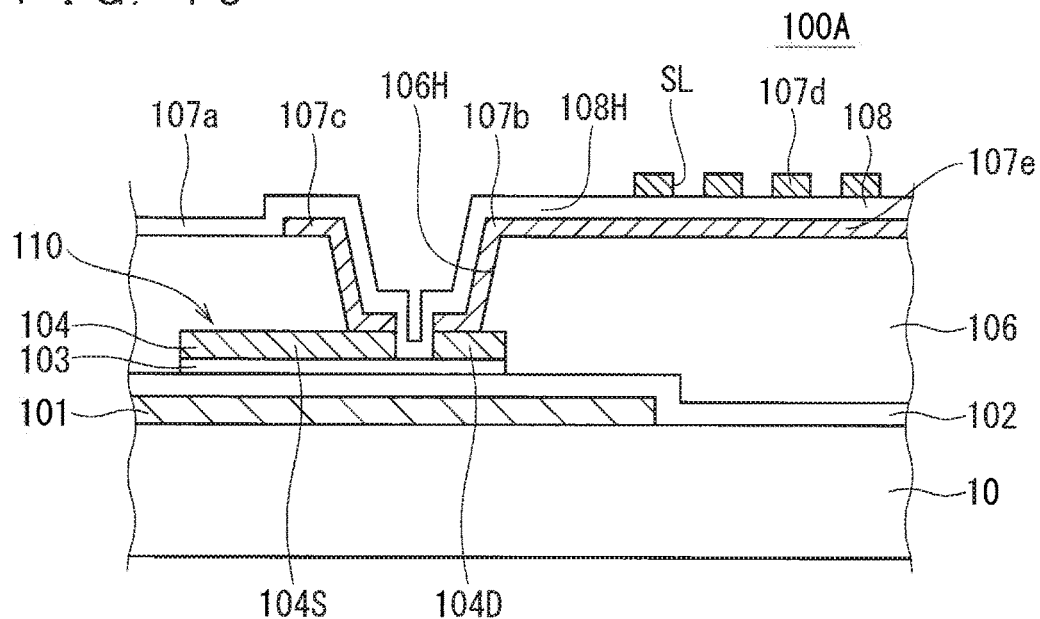
FIG. 15 is a cross-sectional view showing a configuration of a liquid crystal display panel according to a modification of the first preferred embodiment of the present invention.

FIG. 15 is a cross-sectional view of one pixel of an array substrate 100A according to a modification of the first preferred embodiment. As shown in FIG. 15, a common electrode 107d serves as an upper electrode and a pixel electrode 107e integrally formed with the transparent conductive film 107b serves as a lower electrode across the insulating film 108.

The common electrode 107d provided on the insulating film 108 is formed of a transparent conductive film such as an ITO film and an IZO film, and has the slits SL at a portion opposed to the pixel electrode 107e.

The pixel electrode 107e is formed in the same process as the transparent conductive films 107b and 107c, and has a size substantially equal to a formation area of a pixel.

Adoption of such a configuration does not require the contact hole 108H, thus not requiring a space for providing the contact hole 108H. Accordingly, a non-display area can be reduced. Further, since the process for forming the contact hole 108H is not required, the array substrate 100A can be obtained through five photolithography processes. Thus, manufacturing costs can be further reduced.

<Second Preferred Embodiment>

The array substrate 100 according to the first preferred embodiment described above has a configuration in which the pixel electrode 109 serves as an upper electrode and the common electrode 107a serves as a lower electrode across the insulating film 108, and the pixel electrode 109 has the slits SL. However, the upper-lower positional relationship between the pixel electrode and the common electrode may be interchanged. Given below is description of an array substrate having such a configuration as a second preferred embodiment of the present invention.

<Device Configuration>

Figure 16:
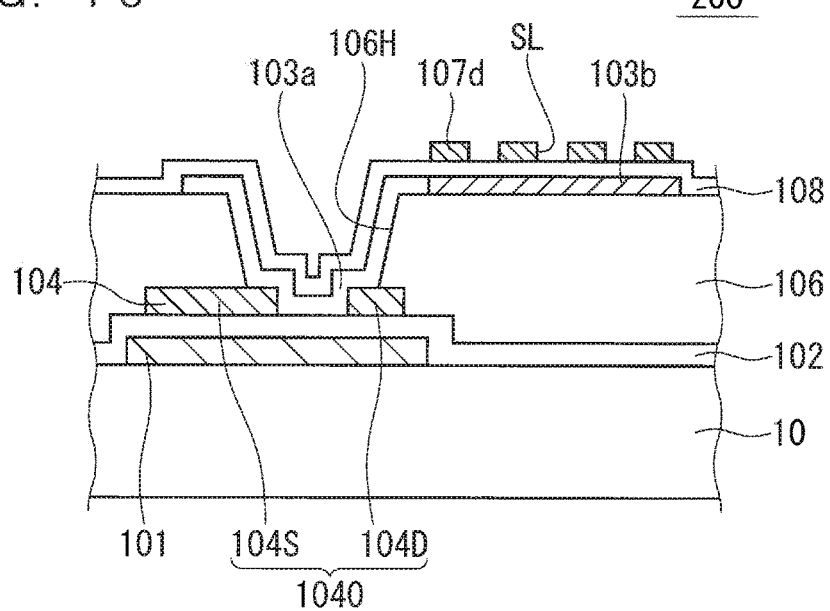
FIG. 16 is a cross-sectional view showing a configuration of a liquid crystal display panel according to a second preferred embodiment of the present invention.

FIG. 16 is a cross-sectional view of one pixel of an array substrate 200 according to the second preferred embodiment. As shown in FIG. 16, in the array substrate 200, a pixel electrode 103b serves as a lower electrode and the common electrode 107d serves as an upper electrode across the insulating film 108.

Further, the signal line 104 is provided directly on the gate insulating film 102 without intermediation of the semiconductor film 103 therebetween. Note that, the signal line branch portion 104O including the signal line 104, the source electrode 104S, and the drain electrode 104D is the same as in the first preferred embodiment. However, a surface of the drain electrode 104D and a surface of the source electrode 104S are brought into contact with a semiconductor film 103a that extends from the upper surface of the planarizing insulating film 106 toward the side surface of the opening 106H. The semiconductor film 103a also exists on the gate insulating film 102 at the separation portion between the source electrode 104S and the drain electrode 104D, and the semiconductor film 103a existing at the portion serves as a channel layer during operation of the TFT 110. Further, the pixel electrode 103b integrated with the semiconductor film 103a is provided on the upper surface of the planarizing insulating film 106.

Here, the semiconductor film 103a is a transparent oxide semiconductor film, not an amorphous silicon semiconductor film nor a crystalline silicon semiconductor film. As the transparent oxide semiconductor film, for example, a non-crystalline InGaZnO-based material, which is obtained by adding gallium oxide ($Ga_2O_3$) and indium oxide ($In_2O_2$) to a zinc oxide (ZnO)-based material or zinc oxide, can be used.

Further, the pixel electrode 103b on the upper surface of the planarizing insulating film 106 is a transparent oxide conductive film. The pixel electrode 103b is formed by reforming, into a transparent oxide conductive film, a part of the semiconductor film 103a that extends from the surface of the drain electrode 104D toward the upper surface of the planarizing insulating film 106.

As described above, the transparent oxide semiconductor film to form the semiconductor film 103a and the transparent oxide conductive film to form the pixel electrode 103b are originally the same transparent oxide semiconductor film when deposited, but are reformed to have different physical properties in subsequent manufacturing processes.

Now, the similarities and differences of the two films are described. The transparent oxide semiconductor film to form the semiconductor film 103a and the transparent oxide conductive film to form the pixel electrode 103b are similar in that the both basically have the same composition even after being reformed into the pixel electrode 103a and the semiconductor film 103b, respectively. Note that, to "have the same composition" herein means that at least a metal composition is the same. Specifically, if the transparent oxide semiconductor film is formed of an InGaZnO-based material, a metal composition refers to a composition ratio of metal atoms that are main constituent elements of the transparent oxide other than oxygen, such as In, Ga, Zn, and Sn.

Note that, the ratio of hydrogen atoms in the oxide is herein not taken into consideration as composition. Hydrogen atoms may exist by entering the oxide as impurity, or by being bonded to a local defect portion. Further, the ratio of oxygen atoms in the oxide may not be taken into consideration as composition because the ratio may vary due to various factors after deposition. Alternatively, the ratio of oxygen atoms in the oxide may be taken into consideration as composition by regarding, as a tolerance, the varying amount that is generated due to treatment processes such as an ultraviolet light irradiation process described later.

As the differences, the transparent oxide semiconductor film to form the semiconductor film 103a exhibits characteristics as a semiconductor, that is, conductive characteristics in which a resistance value significantly varies depending on an applied voltage. The transparent oxide conductive film to form the pixel electrode 103b, in contrast, exhibits characteristics as a conductor, that is, a resistance value is basically reduced down to approximately 0.1 Ωcm or less regardless of an applied voltage.

Further, comparing the two films against another yardstick of physical property, the transparent oxide conductive film to form the pixel electrode 103b has higher electron carrier concentration, thus having physical property of a conductor, in comparison with the transparent oxide semiconductor film to form the semiconductor film 103a.

<Manufacturing Method>

Next, a method of manufacturing the array substrate 200 is described with reference to FIG. 17 to FIG. 20. Note that, the following description is given mainly of a characteristic part of this preferred embodiment, and description of other part is omitted.

Figure 17:
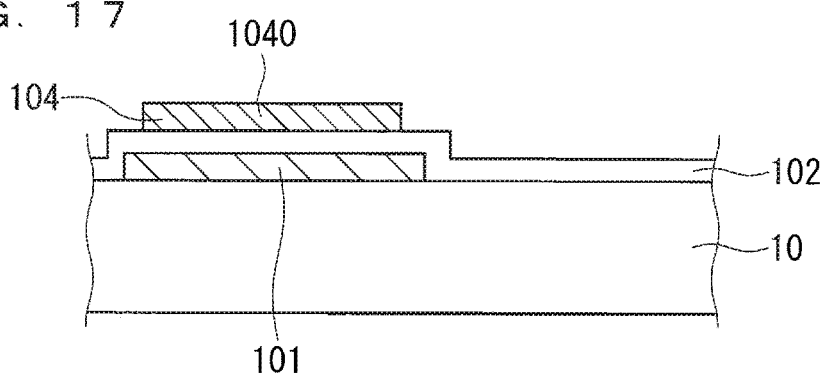
FIG. 17 is a cross-sectional view for illustrating a method of manufacturing the liquid crystal display panel according to the second preferred embodiment of the present invention.

After the gate electrode 101 is selectively formed on the insulating substrate 10 through the processes illustrated with reference to FIG. 4 and FIG. 5, the gate insulating film 102 that covers the insulating substrate 10 is formed as shown in FIG. 17. As for a material of the gate insulating film 102 according to this preferred embodiment, it is preferable that at least the upper surface side to be brought into contact with the transparent oxide semiconductor film be formed of a silicon oxide film. Specifically, it is desirable that the gate insulating film 102 be entirely formed of a silicon oxide film, or be formed of a stacked film having a silicon oxide film in an upper layer and a silicon nitride film in a lower layer.

Next, a metal film is deposited on the gate insulating film 102 using a sputter method, for example. As a material of the metal film, metal such as Al, an alloy containing Al, Cu, Mo, and Cr is used.

Figure 18:
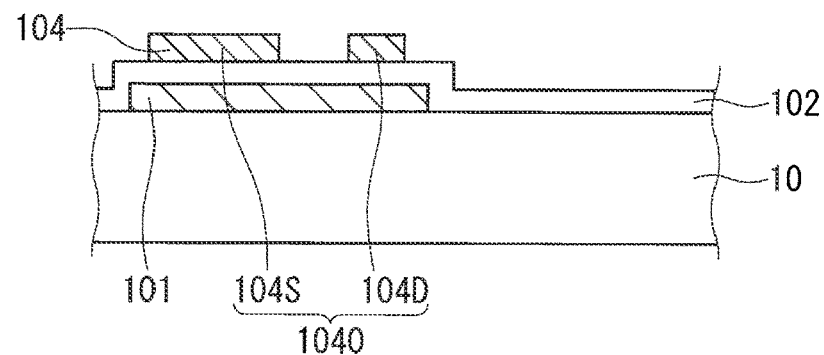
FIG. 18 is a cross-sectional view for illustrating the method of manufacturing the liquid crystal display panel according to the second preferred embodiment of the present invention.

Then, a second photolithography process is performed, where a photosensitive photoresist is applied onto the metal film with a slit method or a spin coat method, and the applied photoresist is exposed to light and then developed. In this manner, a photoresist pattern (a second photoresist pattern) having a desired shape is patterned on the metal film. After that, the metal film is etched using the second photoresist pattern as a mask, and the second photoresist pattern is then removed. With this, as shown in FIG. 18, the signal line 104, the signal line branch portion 1040 (including the source electrode 104S and the drain electrode 104D), and the external wires 112 of the frame area 130 (FIG. 1) are formed on the gate insulating film 102.

Figure 19:
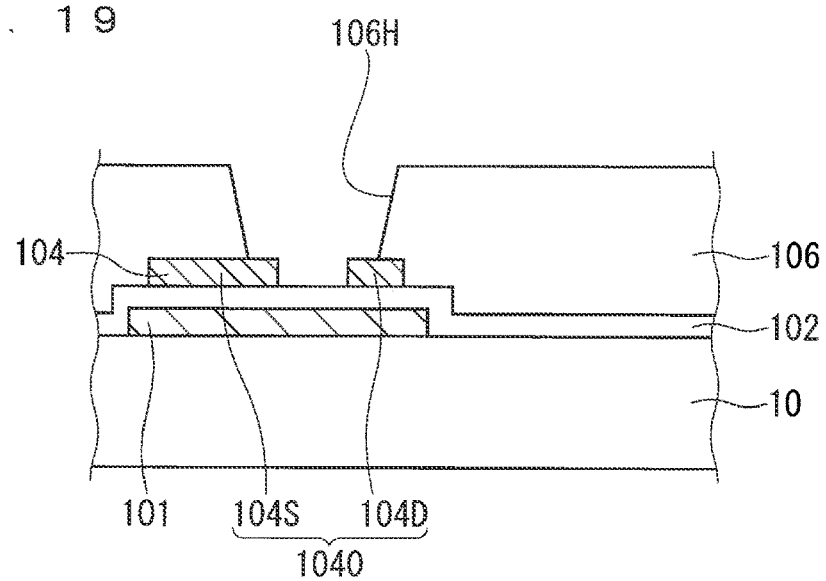
FIG. 19 is a cross-sectional view for illustrating the method of manufacturing the liquid crystal display panel according to the second preferred embodiment of the present invention.

Next, as shown in FIG. 19, the planarizing insulating film 106 is formed on the gate insulating film 102 so as to cover the signal line 104 and the signal line branch portion 1040 (including the source electrode 104S and the drain electrode 104D), and the opening 106H is formed in the planarizing insulating film 106 so as to partially expose the source electrode 104S and the drain electrode 104D. The planarizing insulating film 106 is a SOG film formed of siloxane resin containing silicon, and has photosensitivity. If the planarizing insulating film 106 has photosensitivity, the planarizing insulating film 106 can be patterned through a third photolithography process similarly to a photoresist, allowing formation of the opening 106H. The film thickness of the planarizing insulating film 106 is arranged to range from 1.0 to 3.0 μm, preferably 2.0 μm.

After that, a transparent oxide semiconductor film is deposited to cover the upper surface of the planarizing insulating film 106 and the side surface and the bottom of the opening 106H, using a sputter method, for example. Note that, on the upper surface of the planarizing insulating film 106, the transparent oxide semiconductor film is deposited so as to be extended up to an area to form the pixel electrode 103b.

Here, as a material of the transparent oxide semiconductor film, for example, a non-crystalline InGaZnO-based material, which is obtained by adding gallium oxide ($Ga_2O_3$) and indium oxide ($In_2O_2$) to a zinc oxide (ZnO)-based material or zinc oxide, is used.

Then, a fourth photolithography process is performed, where a photosensitive photoresist is applied onto the transparent oxide semiconductor film with a slit method or a spin coat method, and the applied photoresist is exposed to light and then developed. In this manner, a photoresist pattern (a third photoresist pattern) having a desired shape is patterned on the transparent oxide semiconductor film. After that, the transparent oxide semiconductor film is etched using the third photoresist pattern as a mask, and the third photoresist pattern is then removed.

Figure 20:
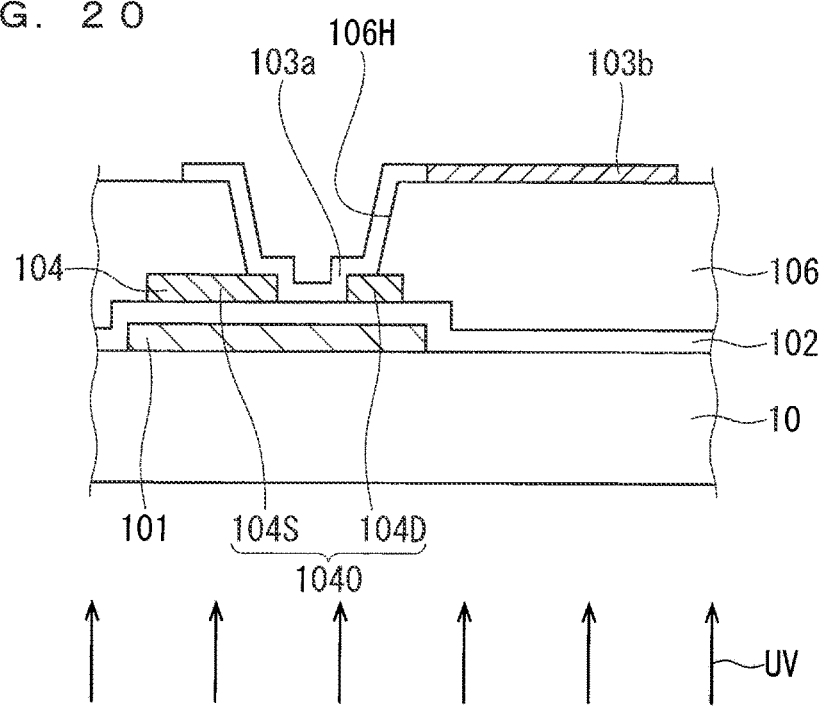
FIG. 20 is a cross-sectional view for illustrating the method of manufacturing the liquid crystal display panel according to the second preferred embodiment of the present invention.

Subsequently, as shown in FIG. 20, the transparent oxide semiconductor film is irradiated by ultraviolet light UV having a wavelength of from 10 to 400 nm from the back-surface side of the insulating substrate 10. As the ultraviolet light UV, for example, light of a low-pressure mercury lamp can be used. Only the transparent oxide semiconductor film in an area to form the pixel electrode 103b is irradiated by the ultraviolet light UV from the back-surface side of the insulating substrate 10. The transparent oxide semiconductor film in the other area is shielded from light by the metal film of the gate electrode 101, so as to become the semiconductor film 103a formed of a transparent oxide semiconductor film. As for the transparent oxide semiconductor film irradiated by the ultraviolet light UV, a specific resistance value is reduced down to 0.1 Ωcm or less, so as to become a conductor to be reformed into a transparent oxide conductive film, thus forming the pixel electrode 103b.

In this manner, since the semiconductor film 103a and the pixel electrode 103b each originally formed of a transparent oxide semiconductor film are patterned using the third photoresist pattern as a common mask, a single photolithography process and a single type of photoresist pattern suffice. Accordingly, manufacturing costs can be reduced.

After that, a silicon nitride film is deposited on the planarizing insulating film 106 with a plasma CVD method, for example, to form the insulating film 108 that covers the semiconductor film 103a and the pixel electrode 103b. Note that, the insulating film 108 may be a silicon oxide film, or may be a stacked film having a silicon oxide film in a lower layer and a silicon nitride film in an upper layer.

Next, a transparent conductive film of indium tin oxide (ITO), indium zinc oxide (IZO), or the like is deposited on the insulating film 108 using a sputter method, for example.

After that, a fifth photolithography process is performed, where a photosensitive photoresist is applied onto the transparent conductive film with a slit method or a spin coat method, and the applied photoresist is exposed to light and then developed. Through the fifth photolithography process, a fourth photoresist pattern is formed, and the transparent conductive film is etched using the fourth photoresist pattern as a mask, thereby forming the common electrode 107d. Note that, as the etching of the transparent conductive film, wet etching using an oxalic acid-based solution is performed. Finally, the fourth photoresist pattern is stripped. With this, the array substrate 200 shown in FIG. 16 is obtained.

Adoption of such a configuration does not require the contact hole 108H, thus not requiring a space for providing the contact hole 108H. Accordingly, a non-display area can be reduced. Further, since the process for forming the contact hole 108H is not required, the array substrate 200 can be obtained through five photolithography processes. Thus, manufacturing costs can be further reduced.

<First Modification>

In the array substrate 200 according to the second preferred embodiment described above, the pixel electrode serves as a lower electrode and the common electrode serves as an upper electrode across the insulating film 108. However, the upper-lower positional relationship between the pixel electrode and the common electrode may be interchanged.

Figure 21:
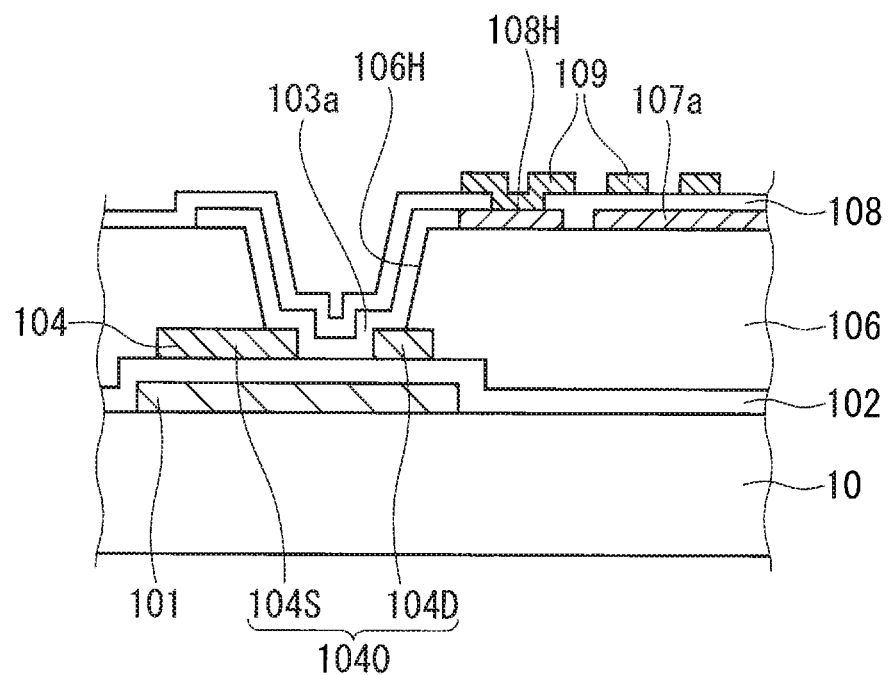
FIG. 21 is a cross-sectional view showing a configuration of a liquid crystal display panel according to a first modification of the second preferred embodiment of the present invention.

FIG. 21 is a cross-sectional view of one pixel according to a first modification of the second preferred embodiment. As shown in FIG. 21, the pixel electrode 109 serves as an upper electrode and the common electrode 107a serves as a lower electrode across the insulating film 108. In this case, the semiconductor film 103a and the common electrode 107a are out of contact with each other and are electrically isolated.

Further, the pixel electrode 109 provided on the insulating film 108 is connected to the semiconductor film 103a through the contact hole 108H provided in the insulating film 108, thereby electrically connecting the pixel electrode 109 to the drain electrode 104D. Note that, the common electrode 107a is reformed into a transparent oxide conductive film by irradiation of ultraviolet light described with reference to FIG. 20. Further, a conductive film that is reformed from a semiconductor film into a transparent oxide conductive film by irradiation of ultraviolet light also exists below the contact hole 108H. The common electrode 107a is connected to this conductive film.

<Second Modification>

Figure 22:
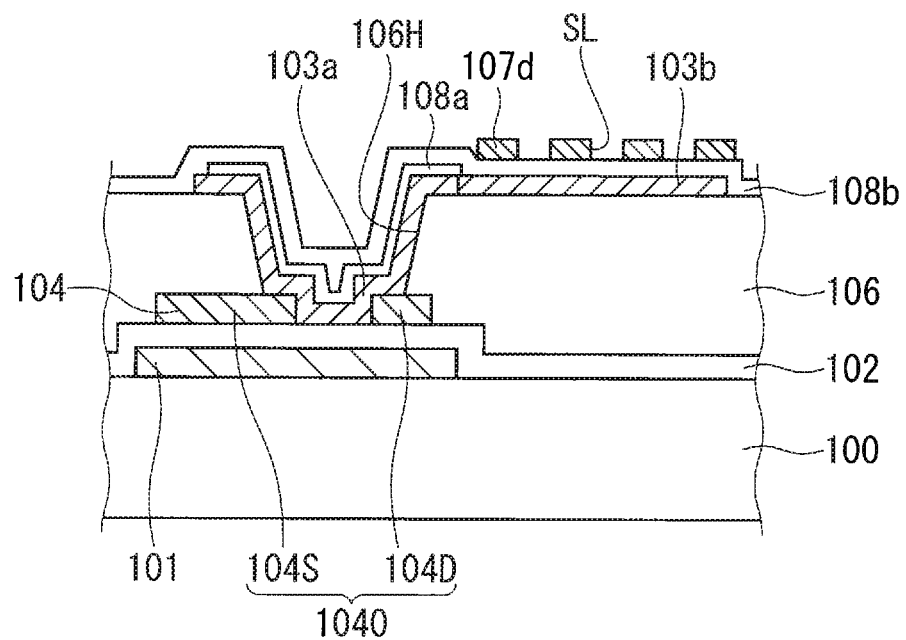
FIG. 22 is a cross-sectional view showing a configuration of a liquid crystal display panel according to a second modification of the second preferred embodiment of the present invention.

As described above in the array substrate 200 according to the second preferred embodiment, if the insulating film 108 is formed of a stacked film having a silicon oxide film in a lower layer and a silicon nitride film in an upper layer, the insulating film 108 may be entirely formed of such a stacked film, or may be partially formed of a stacked film as shown in FIG. 22.

Specifically, an insulating film 108a formed of a silicon oxide film may be formed in an area that comes in contact with the semiconductor film 103a formed of a transparent oxide semiconductor film, and an insulating film 108b formed of a silicon nitride film may be formed on the insulating film 108a, conjointly forming a stacked fill Only the insulating film 108b formed of a silicon nitride film may be formed in an area between the pixel electrode 103b and the common electrode 107d.

Adopting such a configuration, an interface on the back channel side is stabilized because the insulating film 108a formed of a silicon oxide film comes in contact with a channel layer formed of a transparent oxide semiconductor film. In addition, storage capacitance per unit area and per unit film thickness can be increased because the insulating film 108b formed of a silicon nitride film, which has high permittivity, is used as a capacitance insulating film between the common electrode 107d and the pixel electrode 103b.

Note that, in the present invention, each of the preferred embodiments may be freely combined, and each of the preferred embodiments may be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A liquid crystal display panel, comprising
a thin film transistor substrate in which a plurality of pixels are arranged in a matrix pattern, wherein
each of the plurality of pixels comprises:
a gate electrode selectively disposed on a substrate;
a gate insulating film covering the gate electrode;
a semiconductor film disposed on the gate insulating film so as to overlap the gate electrode;
a source electrode and a drain electrode provided on the semiconductor film so as to be separated apart from each other;
a planarizing insulating film covering the gate insulating film, the planarizing insulating film comprising an opening for partially exposing the source electrode and the drain electrode on a bottom of the opening;
a first transparent conductive film and a second transparent conductive film provided to extend from an uppermost surface of the planarizing insulating film toward a side surface of the opening and the bottom of the opening so as to respectively come in contact with a surface of the source electrode and a surface of the drain electrode that are exposed on the bottom of the opening;
an insulating film provided on the planarizing insulating film so as to cover the opening, the first transparent conductive film, and the second transparent conductive film;
a pixel electrode electrically connected to the drain electrode via the second transparent conductive film; and
a counter electrode provided to be opposed to the pixel electrode across the insulating film, and the pixel electrode is provided on the insulating film and is electrically connected to the drain electrode through a contact hole, the contact hole being provided in the insulating film to penetrate the insulating film at a position corresponding to a position above the second transparent conductive film and above the uppermost surface of the planarizing insulating film outside the opening.

2. The liquid crystal display panel according to claim 1, wherein the contact hole is provided at a position corresponding to a position above the gate electrode.

3. The liquid crystal display panel according to claim 1, wherein the semiconductor film is formed of any of an amorphous semiconductor film, a crystalline semiconductor film, and a stacked film of the amorphous semiconductor film and the crystalline semiconductor film.

4. The liquid crystal display panel according to claim 3, wherein the semiconductor film is further provided below a signal line that is connected to the source electrode.

5. The liquid crystal display panel according to claim 1, wherein the planarizing insulating film is formed of a siloxane resin film containing silicon.

6. A method of manufacturing the liquid crystal display panel of claim 1, wherein a process of forming the planarizing insulating film comprises:

a process of applying a photosensitive resin film onto the gate insulating film, the photosensitive resin film comprising a siloxane resin film containing silicon and having photosensitivity;

a process of forming the opening in the photosensitive resin film through a photolithography process;

subsequently to forming the opening, a bleaching process of irradiating the photosensitive resin film with ultraviolet light; and subsequently to the bleaching process, a process of baking the planarizing insulating film.

7. A method of manufacturing the liquid crystal display panel of claim 1, wherein a process of forming the source electrode and the drain electrode that are separated apart from each other on the semiconductor film and a process of forming the first transparent conductive film, the second transparent conductive film, and the counter electrode comprise:

a process of forming a common photoresist pattern through a single photolithography process; and a process of patterning the source electrode, the drain electrode, the first transparent conductive film, the second transparent conductive film, and the counter electrode by using the common photoresist pattern.

\* \* \* \* \*